(12) United States Patent
Sugitani et al.

(10) Patent No.: US 9,496,295 B2
(45) Date of Patent: *Nov. 15, 2016

(54) LIQUID CRYSTAL DISPLAY AND MANUFACTURING METHOD THEREOF

(71) Applicant: Samsung Display Co., Ltd., Yongin, Gyeonggi-do (KR)

(72) Inventors: Koichi Sugitani, Yongin (KR); Hoon Kang, Yongin (KR); Yeun Tae Kim, Yongin (KR); Kyung Tae Chae, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/490,355

(22) Filed: Sep. 18, 2014

(65) Prior Publication Data

US 2015/0200214 A1 Jul. 16, 2015

(30) Foreign Application Priority Data

Jan. 10, 2014 (KR) ........................ 10-2014-0003545

(51) Int. Cl.
*H01L 27/12* (2006.01)
*G02F 1/1334* (2006.01)
*G02F 1/1343* (2006.01)
(Continued)

(52) U.S. Cl.
CPC ......... *H01L 27/1288* (2013.01); *G02F 1/1334* (2013.01); *G02F 1/13439* (2013.01); *G02F 1/133377* (2013.01); *G02F 1/136209* (2013.01); *H01L 27/1214* (2013.01); *G02F 2201/07* (2013.01)

(58) Field of Classification Search
CPC ........... H01L 27/1218; H01L 27/1214; H01L 27/1288; G02F 1/1368; G02F 1/136209; G02F 1/133377; G02F 1/1344; G02F 1/133514; G02F 1/13439
USPC ............. 438/30, 149; 349/158, 156, 46, 138
See application file for complete search history.

(56) References Cited

U.S. PATENT DOCUMENTS 6,141,072 A 10/2000 Drabik et al.
7,005,244 B2 2/2006 Park et al.
(Continued)

FOREIGN PATENT DOCUMENTS

JP 05-206082 8/1993
JP 2007-140556 6/2007
(Continued)

*Primary Examiner* — Michael Trinh
(74) *Attorney, Agent, or Firm* — Knobbe Martens Olson & Bear LLP

(57) ABSTRACT

A method of manufacturing a liquid crystal display includes: forming a sacrificial layer by stacking a non-photosensitive resin; initiating formation of an etch stop layer on the sacrificial layer; forming a photoresist pattern; completing the etch stop layer using the photoresist pattern; ashing the photoresist pattern and the sacrificial layer by using the completed etch stop layer as a mask; forming a microcavity by removing the sacrificial layer; and forming a liquid crystal layer in the microcavity. The horizontal area occupied by the sacrificial layer is reduced by forming the common electrode or the etch stop layer at an upper side, thereby increasing the aperture ratio. Further, the vertical electric field is generated without distortion by horizontally forming the common electrode on the sacrificial layer and forming no common electrode on the sidewall thereof.

20 Claims, 38 Drawing Sheets

(51) Int. Cl.
  *G02F 1/1362* (2006.01)
  *G02F 1/1333* (2006.01)

(56) References Cited

U.S. PATENT DOCUMENTS

| | | | |
|---|---|---|---|
| 7,746,443 B2 * | 6/2010 | Lan | G02F 1/136209 349/106 |
| 7,935,552 B2 * | 5/2011 | Kim | B82Y 10/00 257/E21.532 |
| 9,140,939 B2 * | 9/2015 | Lee | G02F 1/134363 |
| 2012/0319978 A1 * | 12/2012 | Takeuchi | G02F 1/13338 345/173 |
| 2014/0104533 A1 * | 4/2014 | Lee | G02F 1/133377 349/46 |
| 2014/0125908 A1 * | 5/2014 | Hong | G02F 1/1333 349/44 |

FOREIGN PATENT DOCUMENTS

| | | |
|---|---|---|
| KR | 10-2005-0030990 | 4/2005 |
| KR | 10-2012-0026880 | 3/2012 |
| KR | 10-2014-0048459 | 4/2014 |

\* cited by examiner

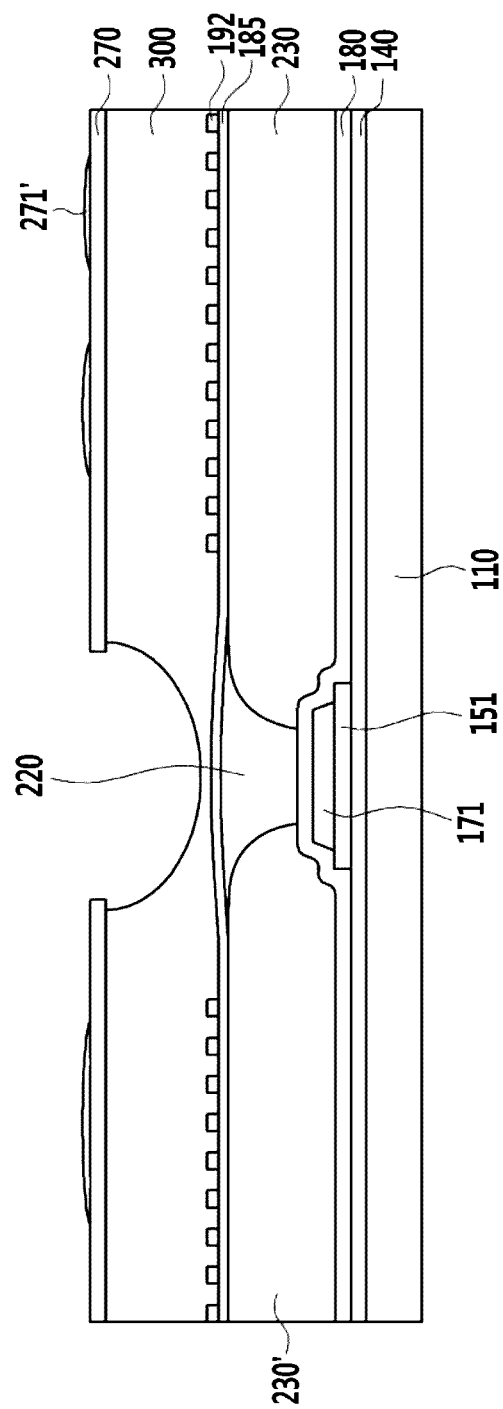

ved by reference under 37 CFR 1.57.
LIQUID CRYSTAL DISPLAY AND MANUFACTURING METHOD THEREOF

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

CROSS-REFERENCE TO RELATED APPLICATIONS

This application claims priority to and the benefit of Korean Patent Application No. 10-2014-0003545 filed in the Korean Intellectual Property Office on Jan. 10, 2014, the entire contents of which are incorporated herein by reference.

BACKGROUND

1. Field

The present disclosure relates to a manufacturing method of a liquid crystal display having a liquid crystal layer (nanocrystal) included in a microcavity.

2. Description of the Related Technology

A liquid crystal display is one of the most common types of flat panel displays currently in use, and includes two display panels formed of field generating electrodes such as a pixel electrode and a common electrode, and a liquid crystal layer interposed therebetween. The liquid crystal display displays an image by applying a voltage to the field generating electrodes to generate an electric field in the liquid crystal layer, determining alignment of liquid crystal molecules of the liquid crystal layer through the generated electric field, and controlling polarization of incident light.

A liquid crystal display having an embedded microcavity (EM) structure (nanocrystal structure) is a device implementing displaying by forming a sacrificial layer by a photoresist, applying a support member on an upper portion of the sacrificial layer, removing the sacrificial layer, and filling liquid crystal in an empty space formed by removing the sacrificial layer.

However, there may be a problem in that an aperture ratio is reduced due to a side wall of the EM structure. Specifically, the side wall of the EM structure has a tapered structure forming a predetermined angle, and since light leakage occurs in the liquid crystal layer positioned in the corresponding structure because a cell gap is different from other portions, the region needs to be covered by a light blocking member. As a result, the aperture ratio is reduced. Further, a common electrode is formed along the side wall of the EM structure, and as a result, there is a problem in that an electric field is distorted.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

The present disclosure has been made in an effort to provide a manufacturing method of a liquid crystal display having a liquid crystal layer (nanocrystal) included in a microcavity, having advantages of an increased aperture ratio and decreased distortion of an electric field. Further, the present disclosure has been made in an effort to provide a manufacturing method of a liquid crystal display having advantages of being capable of reducing deformation of films and generation of an out gas.

One embodiment provides a method of manufacturing a liquid crystal display, including: forming a sacrificial layer by stacking a non-photosensitive resin; initiating formation of an etch stop layer on the sacrificial layer; forming a photoresist pattern; completing the etch stop layer using the photoresist pattern; ashing the photoresist pattern and the sacrificial layer by using the completed etch stop layer as a mask; forming a microcavity by removing the sacrificial layer; and forming a liquid crystal layer in the microcavity.

The photoresist may be a negative photoresist.

The photoresist may be a positive resist, and the method may further include performing hard bake on the photoresist pattern.

The non-photosensitive resin may include 2-methoxy-1-methylethyl acetate and a novolak resin derivative.

The manufacturing method may further include performing a heat treatment on the sacrificial layer.

The etch stop layer may include a transparent conductive material at least one of ITO or IZO.

At least one of oxygen, or oxygen and $SF_6$, may be used as an ashing gas in the ashing.

The etch stop layer may serve as a common electrode receiving common voltage.

The method may further include forming an insulating layer on the completed etch stop layer.

The method may further include removing the etch stop layer, and forming at least one of a common electrode, a lower insulating layer, or a loop layer.

The etch stop layer may include an insulating material includes at least one of SiNx or SiOx.

Oxygen may be used as an ashing gas in the ashing.

The method may further include forming a plurality of gate lines and a plurality of data lines on an insulation substrate, forming a plurality of thin film transistors connected to the gate lines and the data lines, and forming a plurality of color filters on the thin film transistors.

The method may further include forming light blocking members disposed between two adjacent color filters and corresponding to the data lines and the gate lines.

The method may further include forming a loop layer on the insulating layer, and etching the loop layer formed on an open region of a liquid crystal hole.

The liquid crystal layer may be formed by injecting a liquid crystal with a capillary force.

A horizontal width of a sidewall of the sacrificial layer is between about 1 to about 2 μm in the ashing of the sacrificial layer.

The manufacturing method may further include forming a common electrode and a pixel electrode.

In accordance with certain embodiments, the horizontal area occupied by the sacrificial layer is reduced by forming the common electrode or the etch stop layer at an upper side, thereby increasing the aperture ratio. Further, the vertical electric field is generated without distortion by horizontally forming the common electrode on the sacrificial layer and forming no common electrode on the sidewall thereof.

Further, it is possible to reduce deformation of films and generation of the out gas by using the non-photosensitive material as the material of the sacrificial layer.

BRIEF DESCRIPTION OF THE DRAWINGS

FIGS. 1-3, 4A-4B, 5A-5B, 6A-6G, 7A-7C, 8A-8C, 9A-9C and 10A-10D sequentially show a manufacturing method of a liquid crystal display in accordance with an embodiment.

DETAILED DESCRIPTION OF CERTAIN INVENTIVE EMBODIMENTS

Figure 1:
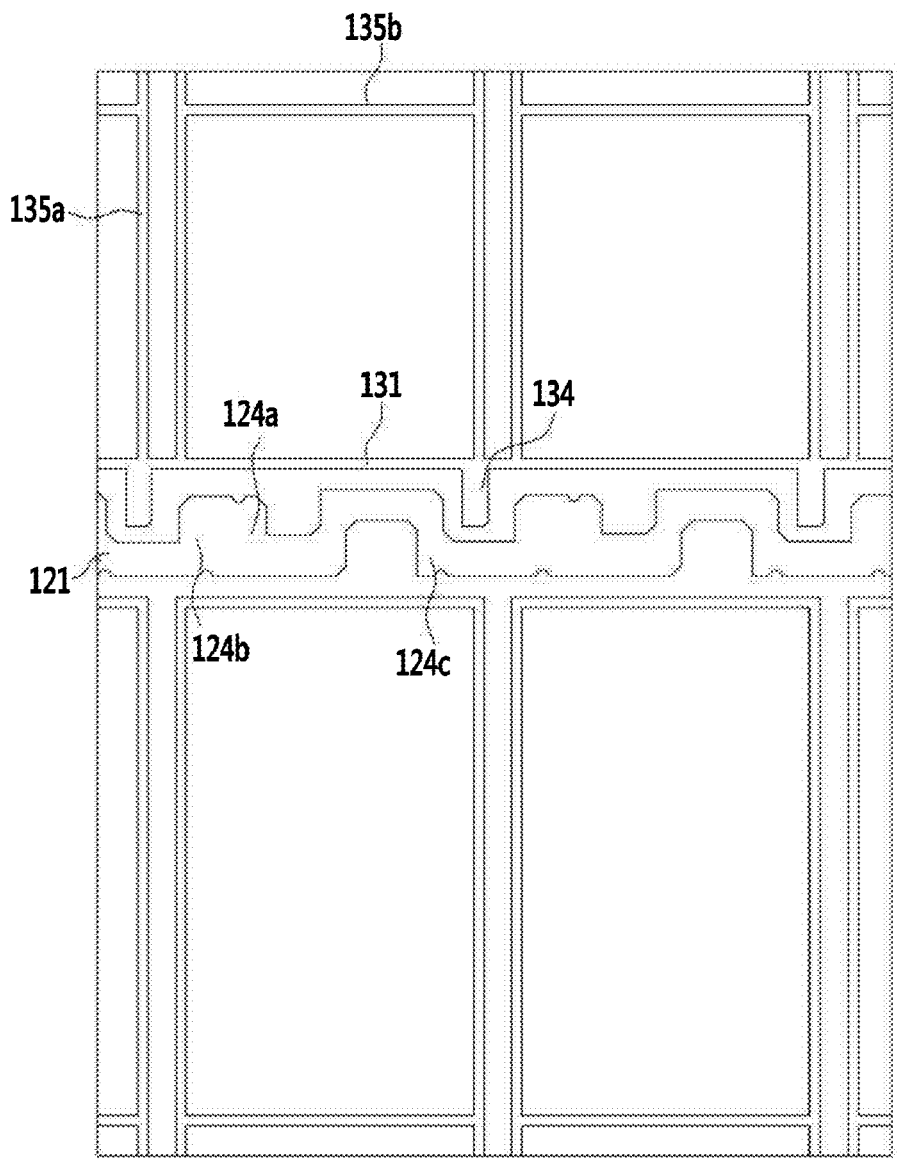

The present disclosure will be described more fully hereinafter with reference to the accompanying drawings, in which certain embodiments are shown. As those skilled in the art would realize, the described embodiments may be modified in various ways, without departing from the spirit or scope of the present invention.

In the drawings, the thickness of layers, films, panels, regions, etc., may be exaggerated for clarity. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, a manufacturing method of the liquid crystal display in accordance with an embodiment will be described with reference to FIG. 1 to FIG. 10.

FIG. 1 to FIG. 10 sequentially show the manufacturing method of the liquid crystal display in accordance with an embodiment.

FIG. 1 is a layout view showing a gate line 121 and a storage voltage line 131 formed on the insulation substrate 110.

Referring to FIG. 1, the gate line 121 and the storage voltage line 131 are formed on an insulation substrate 110 made of transparent glass or plastic. The gate line 121 and the storage voltage line 131 may be simultaneously formed with the same material by using the same mask. Further, the gate line 121 includes a first gate electrode 124a, a second gate electrode 124b, and a third gate electrode 124c, and the storage voltage line 131 includes a protrusion 134 protruding in the direction of storage electrodes 135a and 135b and the gate line 121. The storage electrodes 135a and 135b have a structure surrounding a first subpixel electrode 192h and a second subpixel electrode 192l of a front pixel (See FIG. 5A). Since a data voltage is applied to the gate line 121 and storage voltage is applied to the storage voltage line 131, the gate line 121 and the storage voltage line 131 are separated from each other. The storage voltage may have a predetermined voltage level or have a swing voltage level.

The gate insulating layer 140 covering the gate line 121 and the storage voltage line 131 is formed on the gate line 121 and the storage voltage line 131.

Figure 2:
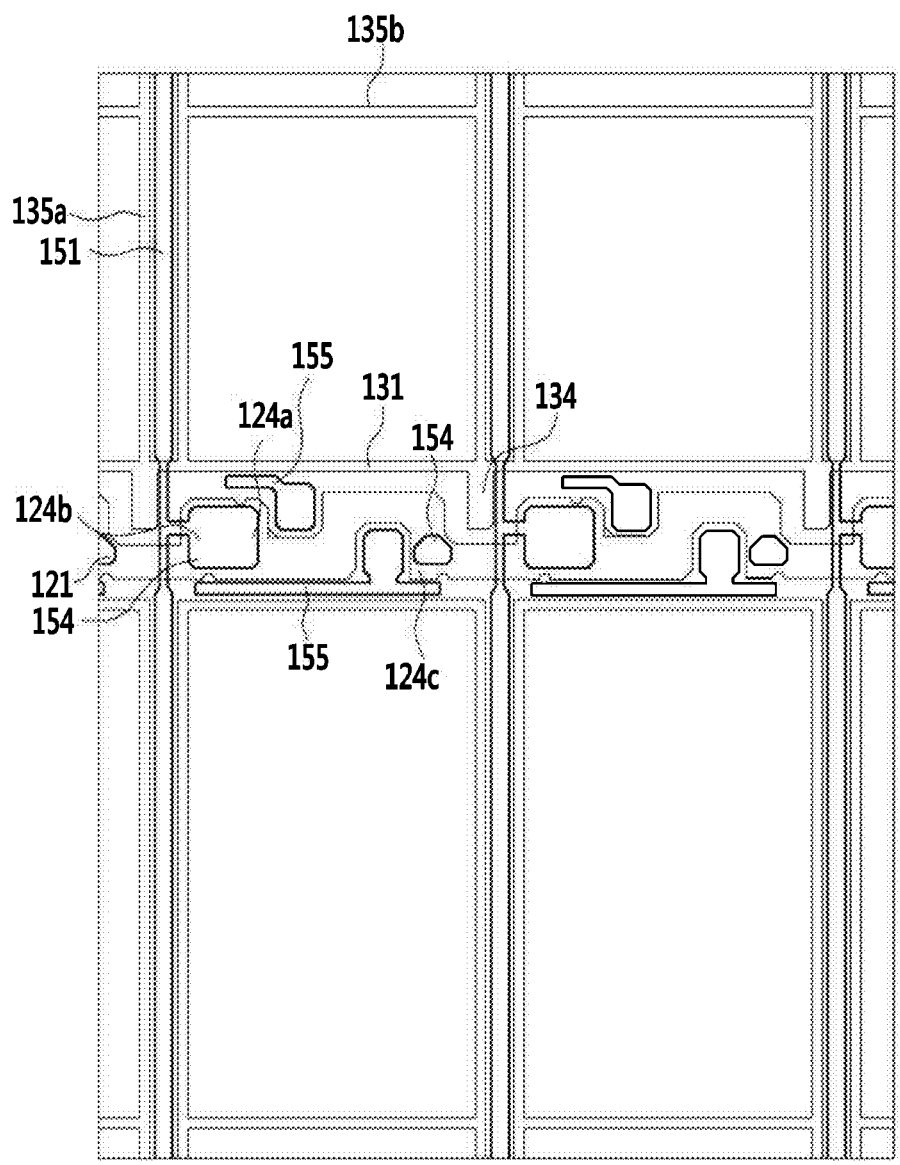
Figure 3:
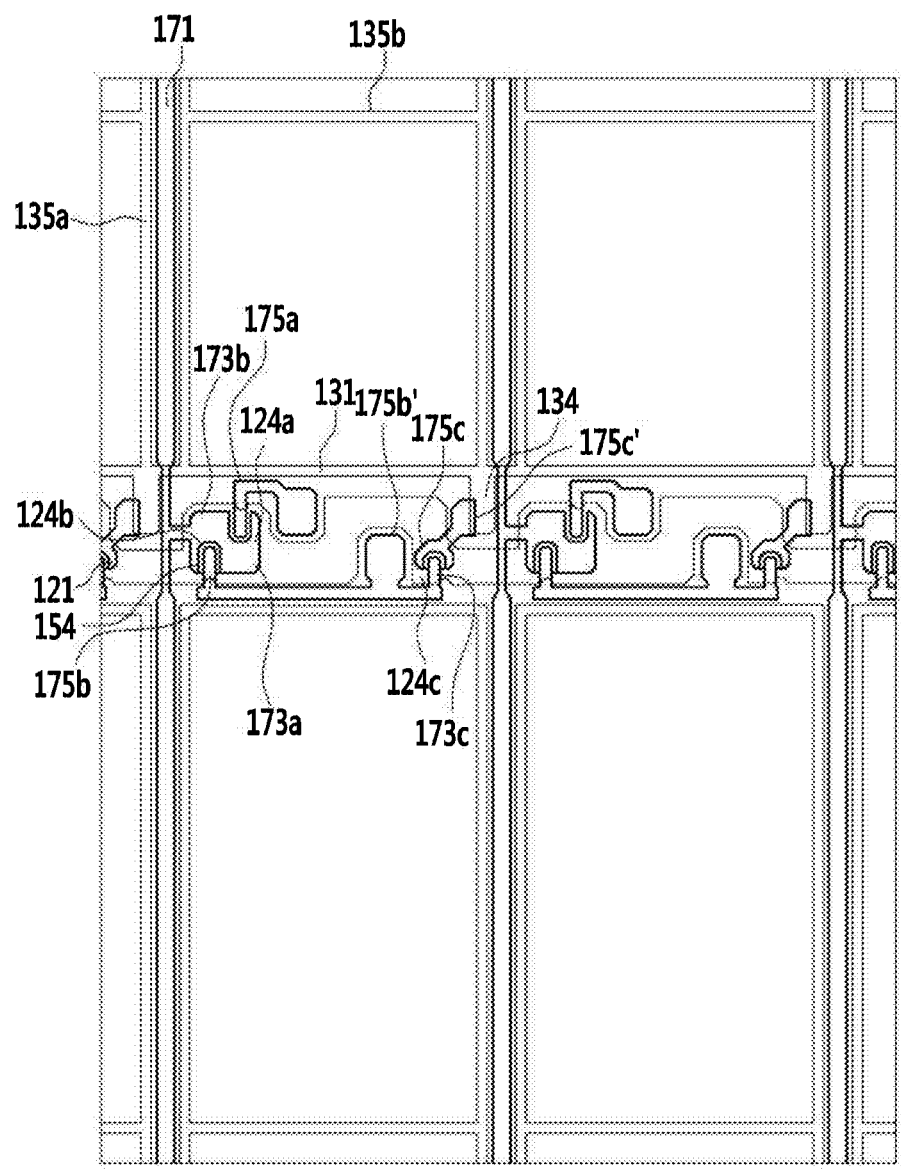

As illustrated in FIG. 2 and FIG. 3, semiconductors 151, 154, and 155, a data line 171, and source/drain electrodes 173a, 173b, 173c, 175a, 175b, and 175c are formed on the gate insulating layer 140.

FIG. 2 illustrates a layout view in which the semiconductors 151, 154, and 155 are formed, and FIG. 3 illustrates a layout view in which the data line 171 and the source/drain electrodes 173a, 173b, 173c, 175a, 175b, and 175c are formed, but the semiconductors 151, 154, and 155, the data line 171, and the source/drain electrodes 173a, 173b, 173c, 175a, 175b, and 175c may be formed together by the following process.

Materials for forming the semiconductors and material for forming the data line and the source/drain electrodes are sequentially stacked. Thereafter, two patterns are formed together through one process of exposure, developing, and etching by using one mask (slit mask or transflective mask). In order for the semiconductor 154 positioned at the channel part of the thin film transistor to not be etched, the corresponding portion is exposed through the slit or transflective region of the mask.

At that time, a plurality of ohmic contacts may be formed on the respective semiconductors 151, 154, and 155 and between the data line 171 and the source/drain electrodes.

The first passivation layer 180 is formed all over the data conductors 171, 173c, 175a, 175b, and 175c and the exposed semiconductor 154 portion. The first passivation layer 180 may include an inorganic insulator such as, for example, a silicon nitride (SiNx) and a silicon oxide (SiOx) or an organic insulator.

Figure 4A:
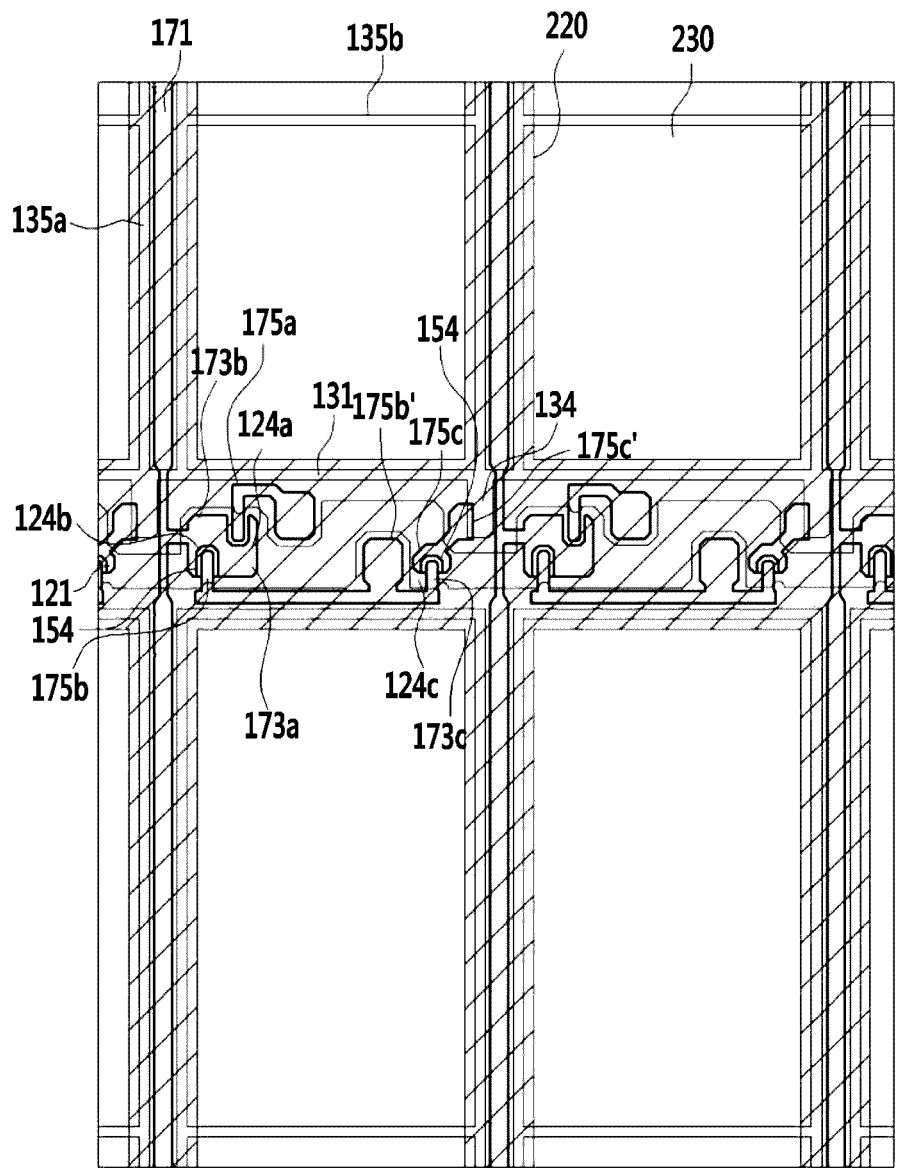
Figure 4B:
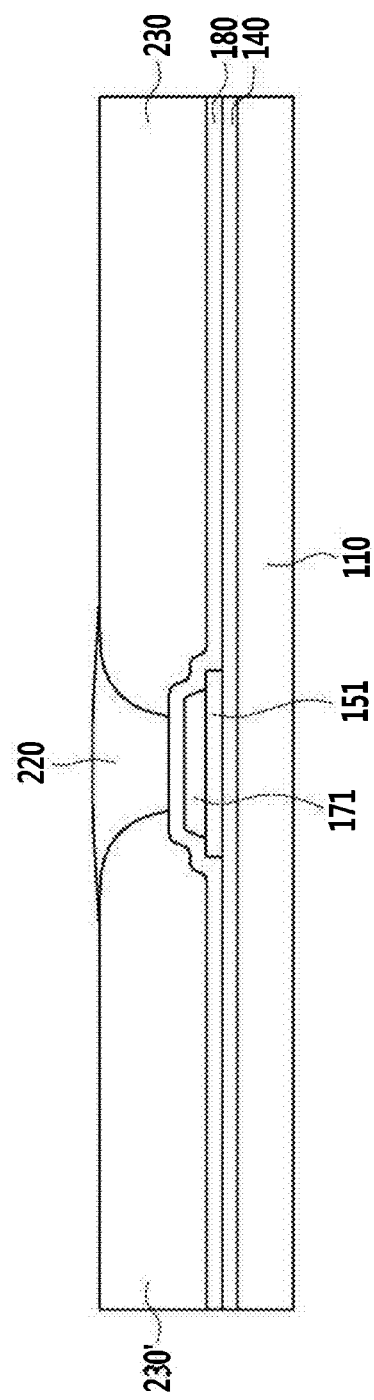

Thereafter, as illustrated in FIG. 4A and FIG. 4B, a color filter 230 and a black matrix 220 are formed on the first passivation layer 180. Herein, FIG. 4A is a layout view showing the liquid crystal display of an embodiment, FIG. 4B is a cross-sectional view showing the liquid crystal display, and FIG. 7B illustrates a color filter 230 and a black matrix 220 formed after exposing and etching.

Before the black matrix 220 is formed, the color filter 230 is formed. The color filter 230 having one color is elongated in a vertical direction (data line direction), and color filters 230 and 230' having different colors are formed in adjacent pixels in a horizontal direction (gate line direction). As a result, exposing, developing, and etching processes need to be performed for each color filter 230. A liquid crystal display including three primary colors forms the color filter 230 by the exposing, developing, and etching processes three times. In this case, the color filter 230' which is first formed on the data line 171 is positioned at the lower portion and the color filter 230 which is formed thereafter is formed at the upper portion, and the color filter 230' and the color filter 230 may be overlapped with each other.

The color filter 230 may be removed in advance at the position where the contact holes 186a, 186b, and 186c are formed during etching of the color filter 230.

The black matrix 220 is formed on the color filter 230 with a non-transmissive material. Referring to an oblique portion (illustrating the black matrix 220) of FIG. 4A, the black matrix 220 is formed in a lattice structure having an opening corresponding to a region where an image is displayed. The color filter 230 is formed in the opening.

The black matrix 220 has a portion formed in a horizontal direction along a transistor formation region with the gate line 121, the storage voltage line 131, and the thin film transistor and a portion formed in a vertical direction based on a region with the data line 171, as illustrated in FIG. 4A.

Figure 5A:
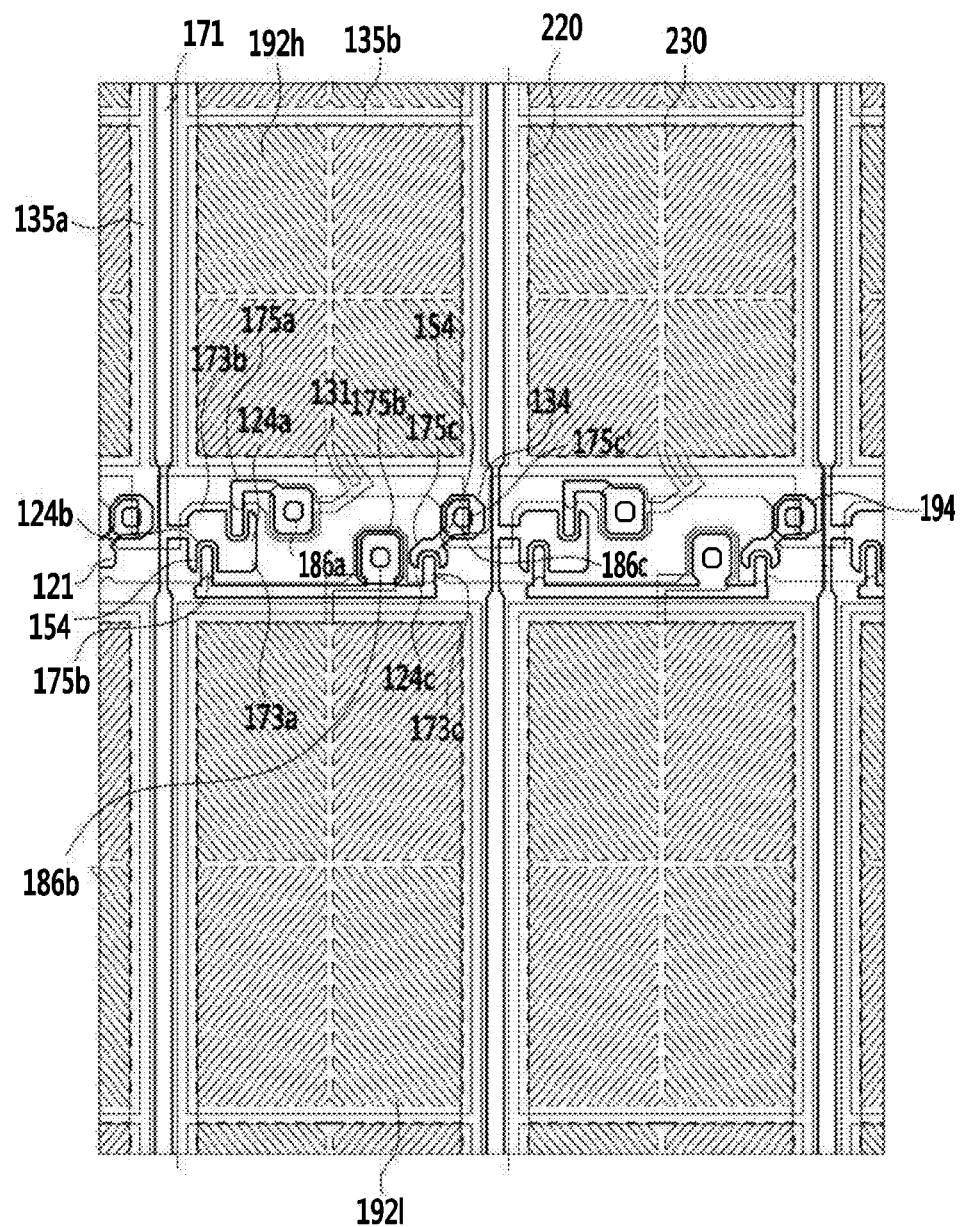
Figure 5B:
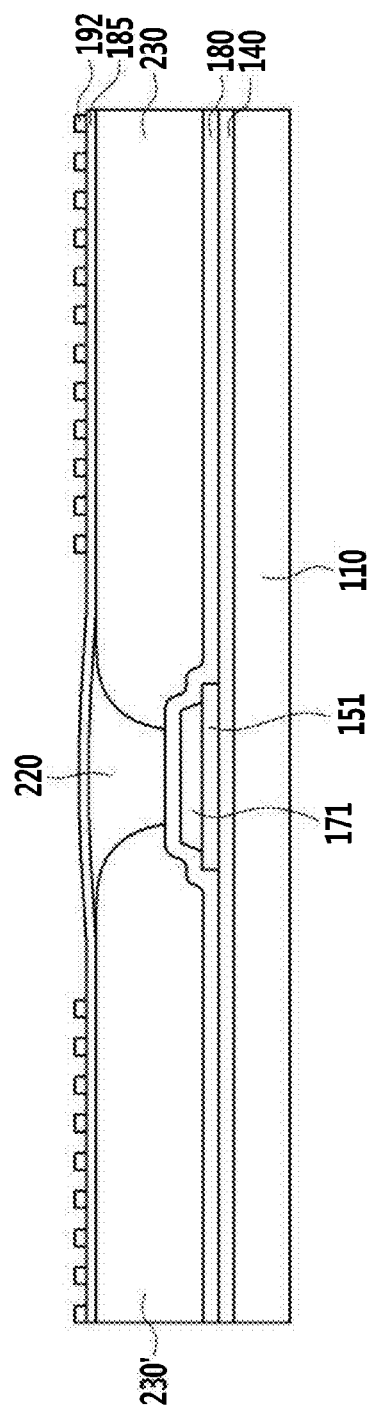

Referring to FIG. 5A and FIG. 5B, the second passivation layer 185 is formed all over the color filter 230 and the black matrix 220. The second passivation layer 185 may include an inorganic insulator such as, for example, a silicon nitride (SiNx) and a silicon oxide (SiOx) or an organic insulator.

Thereafter, a first contact hole 186a and a second contact hole 186b exposing the first drain electrode 175a and the extension 175b' of the second drain electrode 175b, respectively, are formed in the color filter 230, the black matrix 220, and the passivation layers 180 and 185. Further, in the color filter 230, the black matrix 220, and the passivation layers 180 and 185, the third contact hole 186c exposing the protrusion 134 of the storage voltage line 131 and the extension 175c' of the third drain electrode 175c are formed.

Thereafter, the pixel electrode 192 including the first subpixel electrode 192h and the second subpixel electrode 192l is formed on the second passivation layer 185. The pixel electrode 192 may include a transparent conductive material such as, for example, ITO or IZO. Further, the first subpixel electrode 192h and the second subpixel electrode 192l are physically and electrically connected with the first drain electrode 175a and the second drain electrode 175b through the contact holes 186a and 186b, respectively. Further, the connector 194 that electrically connects the extension 175c' of the third drain electrode 175c and the protrusion 134 of the storage voltage line 131 through the third contact hole 186c is formed. As a result, a part of the data voltage applied to the second drain electrode 175b is divided through the third source electrode 173c, and a magnitude of the voltage applied to the second subpixel electrode 192l may be smaller than a magnitude of the voltage applied to the first subpixel electrode 192h.

FIG. 5B is a cross-sectional view of the liquid crystal display, and specifically illustrates the cross-sectional view of the liquid crystal display formed up to FIG. 5A.

Figure 6A:
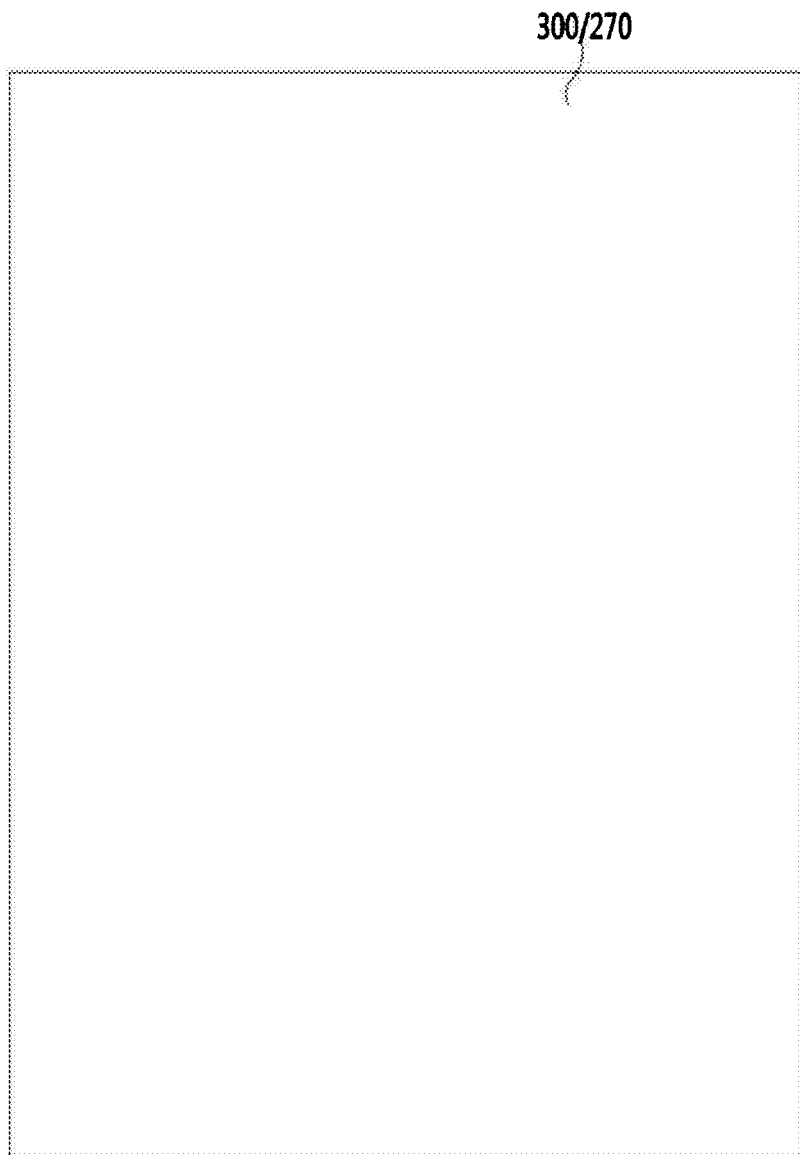
Figure 6B:
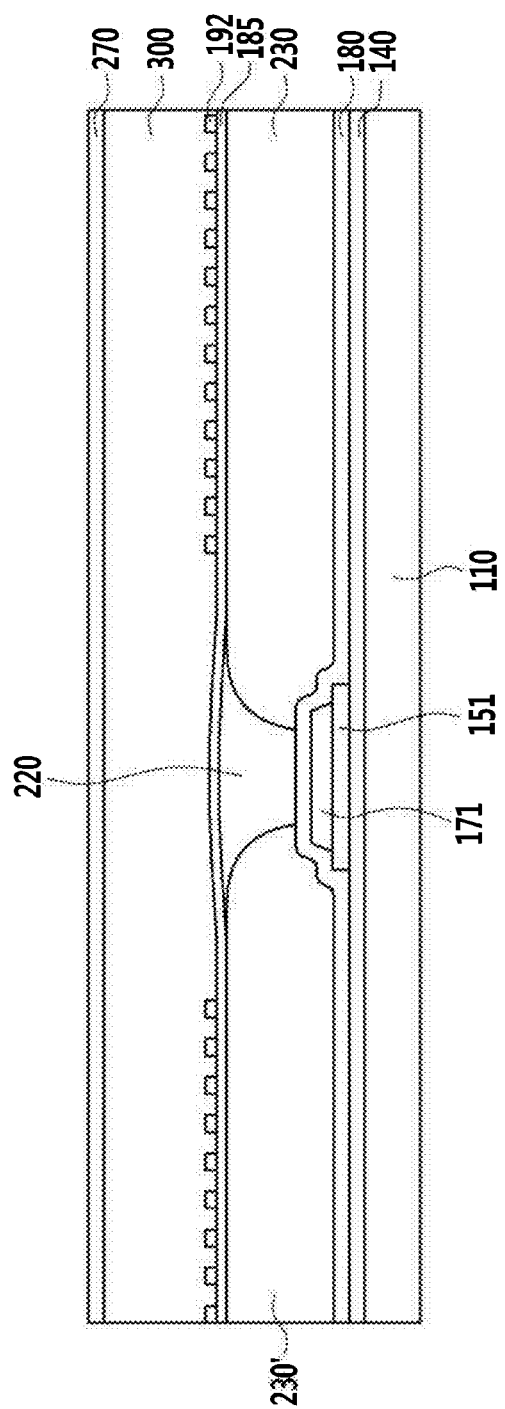
Figure 6C:
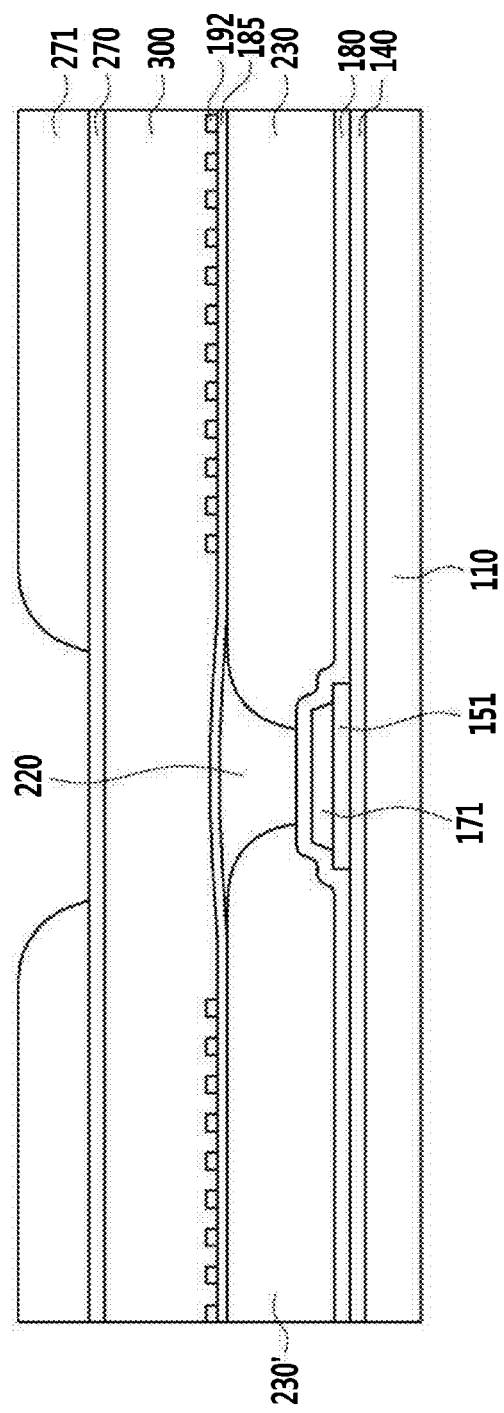
Figure 6D:
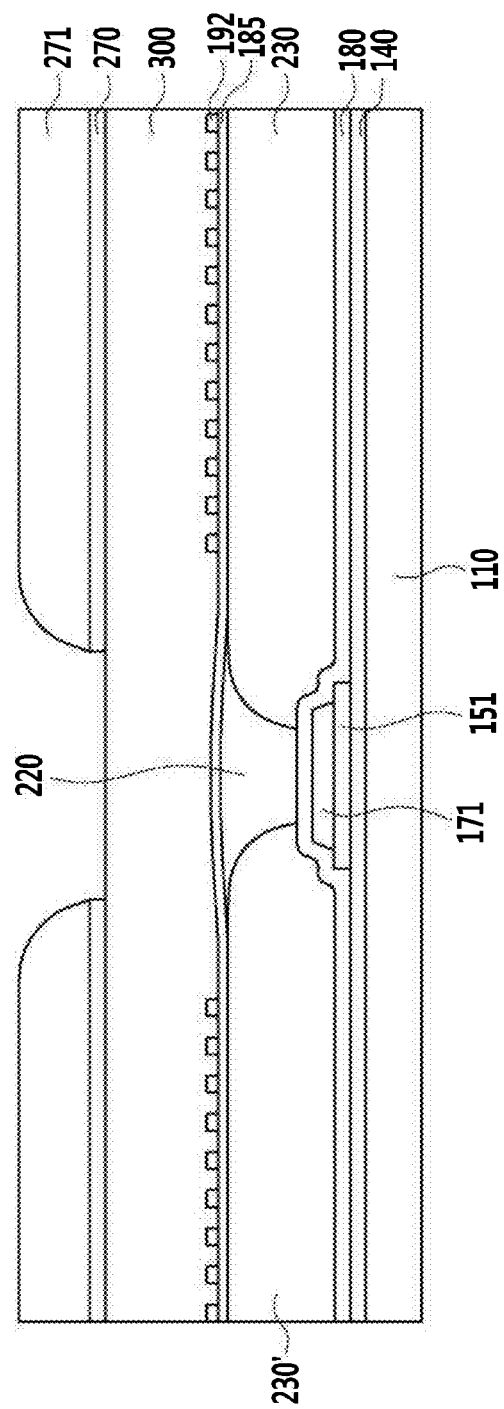
Figure 6F:
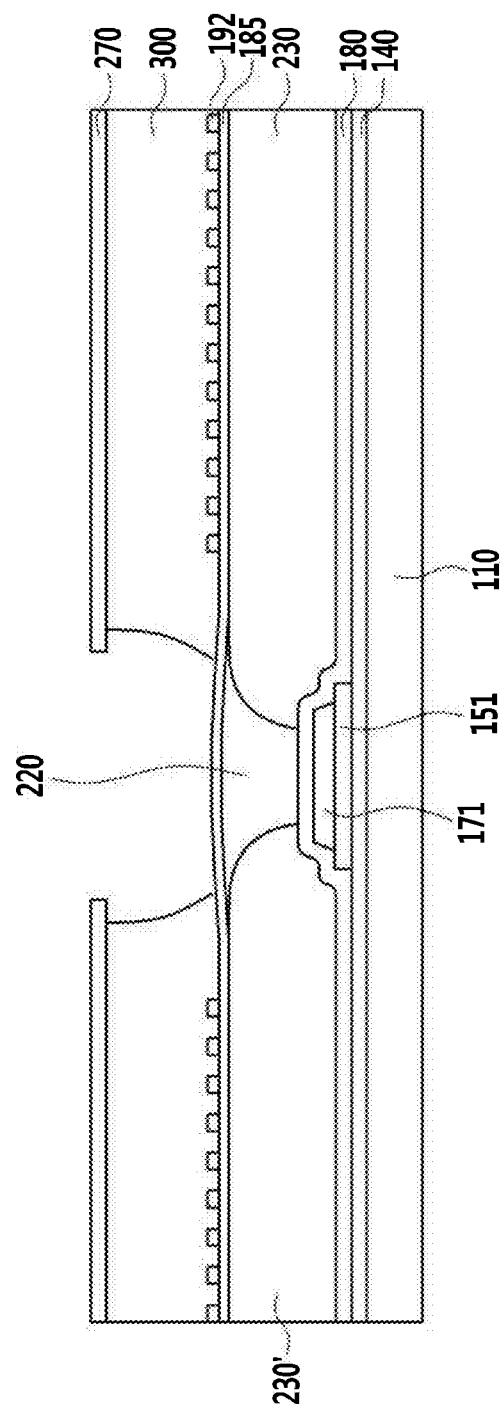
Figure 6G:
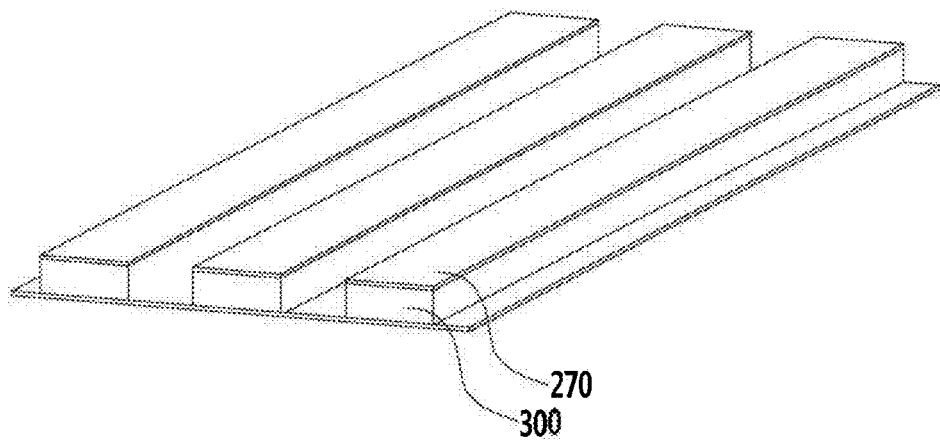

Thereafter, as illustrated in FIG. 6G, a sacrificial layer 300 and the common electrode 270 are formed. The common electrode 270 serves as an etch stop layer of the sacrificial layer 300.

The sacrificial layer 300 and the common electrode 270 are manufactured by the following method.

As illustrated in FIG. 6A and FIG. 6B, a non-photosensitive resin is stacked on the entire surface of the liquid crystal panel with the second passivation layer 185, the pixel electrode 192, and the like to form the sacrificial layer 300, and a hard bake is performed to improve a heat resistance of the entire sacrificial layer 300.

Thereafter, a transparent conductive material such as, for example, indium tin oxide (ITO) or indium zinc oxide (IZO), is stacked to form the common electrode 270.

In general, a photoresist PR is used as a material of the sacrificial layer 300. In this case, an out gas is easily produced due to a photoresist remaining in the sacrificial layer 300 after a forming process of the sacrificial layer 300, thereby making it easy to generate bubbles, which may cause films to be deformed. Further, it is also necessary to perform the hard bake for a long time to reduce an out gas which may be generated in the sacrificial layer 300.

Accordingly, in one embodiment, a non-photosensitive resin obtained by removing a photosensitive material from the photoresist PR as a forming material of the sacrificial layer 300 is used. This is because a main cause of generation of an out gas from the sacrificial layer 300 after the forming process of the sacrificial layer 300 and deformation of films is the photosensitive material of a mixture of the photoresist PR.

In this way, by using a non-photosensitive resin as the material of the sacrificial layer 300 instead of the photoresist PR, it is possible to reduce the out gas in the manufacturing process after the sacrificial layer 300 is stacked, and it is also possible to prevent generation of the bubbles in the sacrificial layer 300 in advance, thereby preventing deformation of films. Further, it is possible to perform the hard bake for a lesser time by alleviating a hard bake condition, or to omit the hard bake process.

In general, in the manufacturing method of the liquid crystal display having the liquid crystal layer included in the microcavity, as the material of the sacrificial layer 300, a mixture of 2-methoxy-1-methylethyl acetate, benzyl alcohol, a novolak resin derivative, and diazonaphthoquinone sulfonic ester, or the like, is employed. The photosensitive material is the diazonaphthoquinone sulfonic ester, and this material remains in the sacrificial layer 300 after the forming process of the sacrificial layer 300 to generate the out gas, which causes deformation of films.

Accordingly, in the manufacturing method of the liquid crystal display in accordance with an embodiment, as the material of the sacrificial layer 300, a mixture of 2-methoxy-1-methylethyl acetate, benzyl alcohol, and a novolak resin derivative without the diazonaphthoquinone sulfonic ester may be employed, but it is not limited thereto.

Thereafter, as illustrated in FIG. 6C, the photoresist PR is stacked and is subjected to hard bake, and then exposed and developed to form a photoresist pattern 271.

The hard bake on the photoresist PR may be performed to prevent side etching of the common electrode 270 when the common electrode 270 on which a material such as ITO or IZO is formed is etched.

The photoresist PR may be a positive photoresist or a negative photoresist.

In the case of using a positive photoresist, an elastic modulus of the sacrificial layer 300 is deteriorated due to heat in the hard bake of the photoresist, and thus wrinkles may be generated due to a stress applied at an interface between the sacrificial layer 300 and the common electrode 270 on which the transparent conductive material such as ITO or IZO is stacked.

In contrast, in the case of using a negative photoresist, curing may be performed by light through exposure and development even though the hard bake is not performed.

Next, as illustrated in FIG. 6D, the transparent conductive material is etched by using the photoresist pattern 271 as a mask to complete the common electrode 270.

Next, as illustrated in FIG. 6E and FIG. 6F, the common electrode 270 is etched and then the exposed sacrificial layer 300 and photoresist pattern 271 are removed by ashing. In this case, the ashing gas may be oxygen ($O_2$) or both oxygen ($O_2$) and $SF_6$, for example. Since the common electrode 270 including the transparent conductive material is not etched, and only the sacrificial layer 300 and the photoresist pattern 271 including the photoresist PR are removed by the ashing gas, the ashing gas has a state like FIG. 6F via a state like FIG. 6E when the ashing is completed. When the non-photosensitive resin is removed by the ashing, anisotropic etching is performed with dry etch equipment and thus the side wall of the sacrificial layer 300 may be substantially vertically formed. As a result, the side wall of the sacrificial layer 300 does not largely occupy the horizontal area.

Accordingly, as illustrated in FIG. 6G, linear patterns of the sacrificial layer 300 and the common electrode 270 are completed.

Figure 7A:
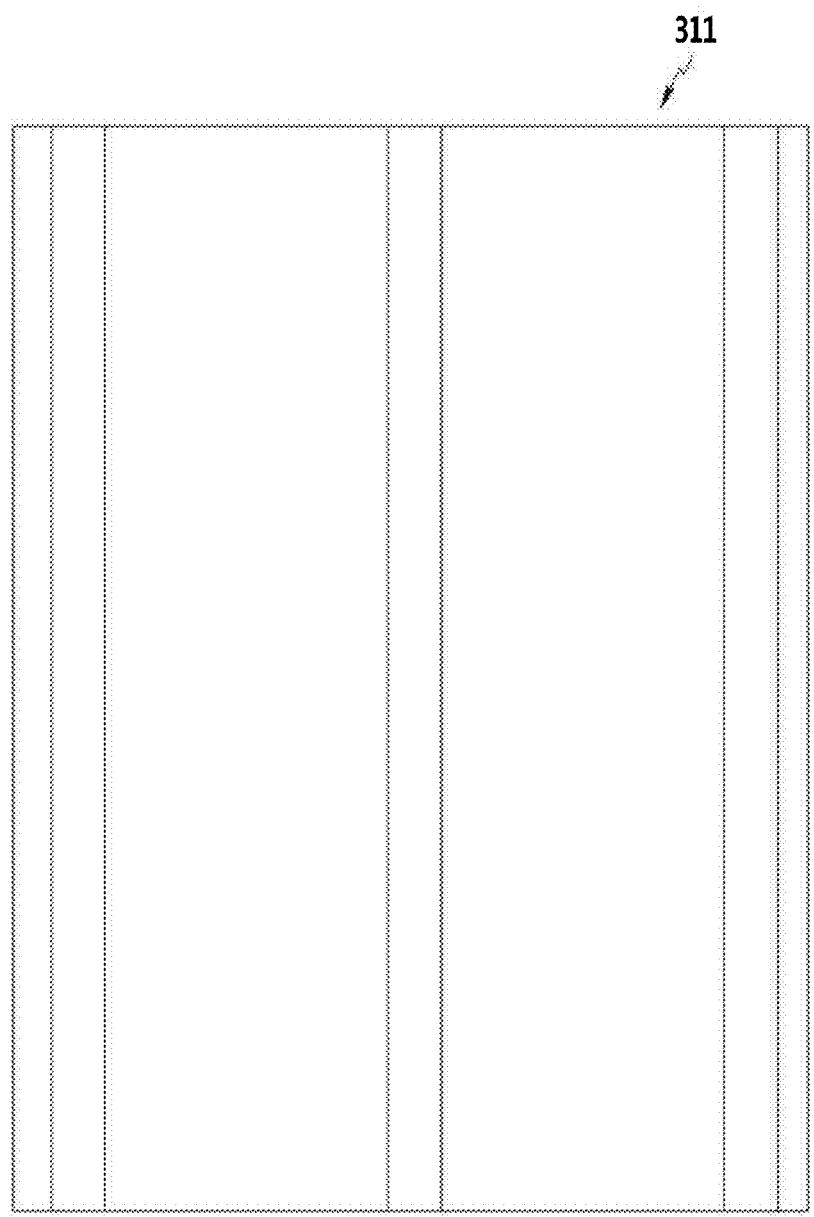
Figure 7B:
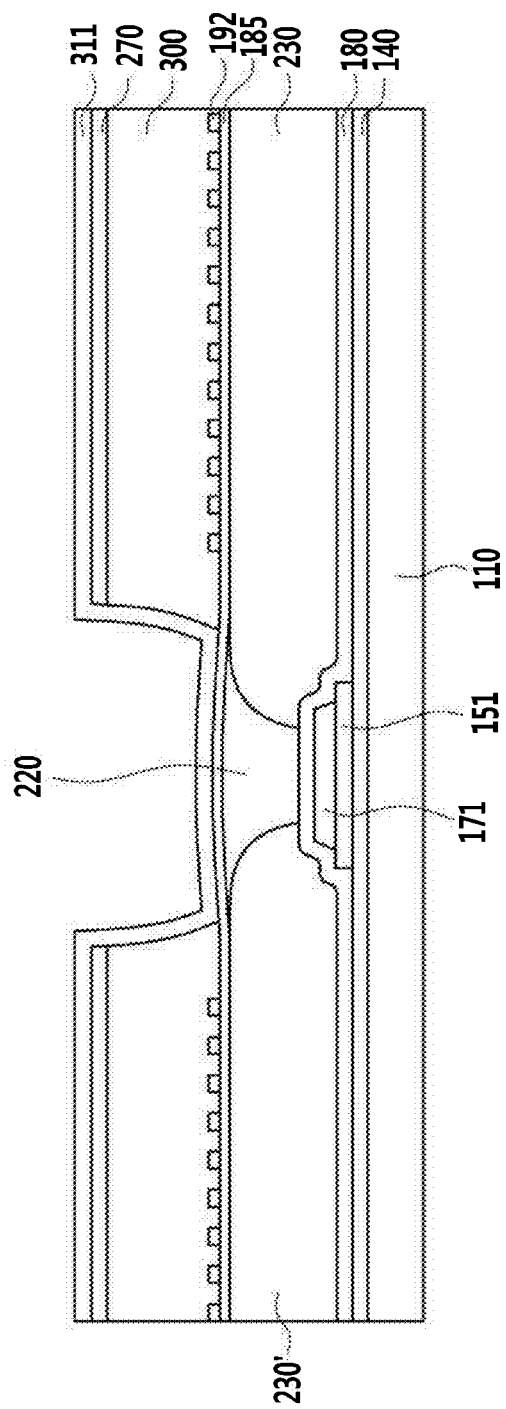
Figure 7C:
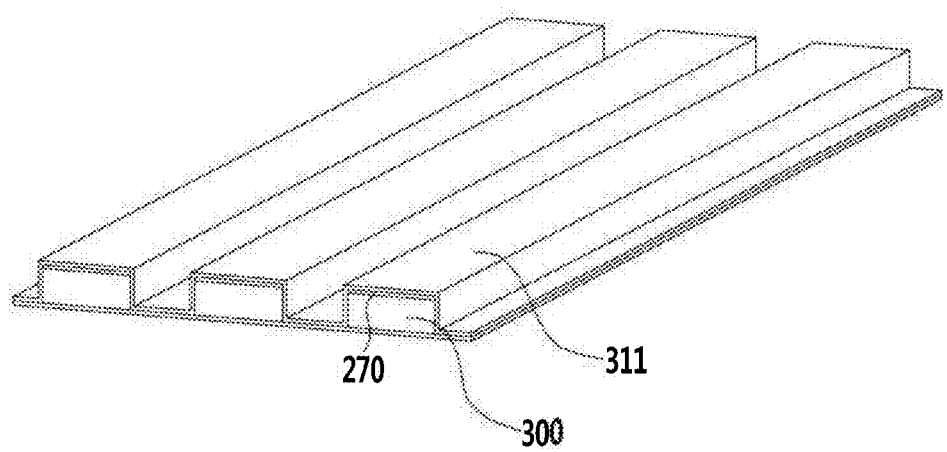

Next, as illustrated in FIG. 7A to FIG. 7C, the lower insulating layer 311 including an inorganic insulating material such as, for example, a silicon nitride (SiNx) is formed on the entire surface of the liquid crystal panel with the linear patterns of the sacrificial layer 300 and the common electrode 270. The lower insulating layer 311 covers the linear patterns of the sacrificial layer 300 and the common electrode 270.

Figure 8A:
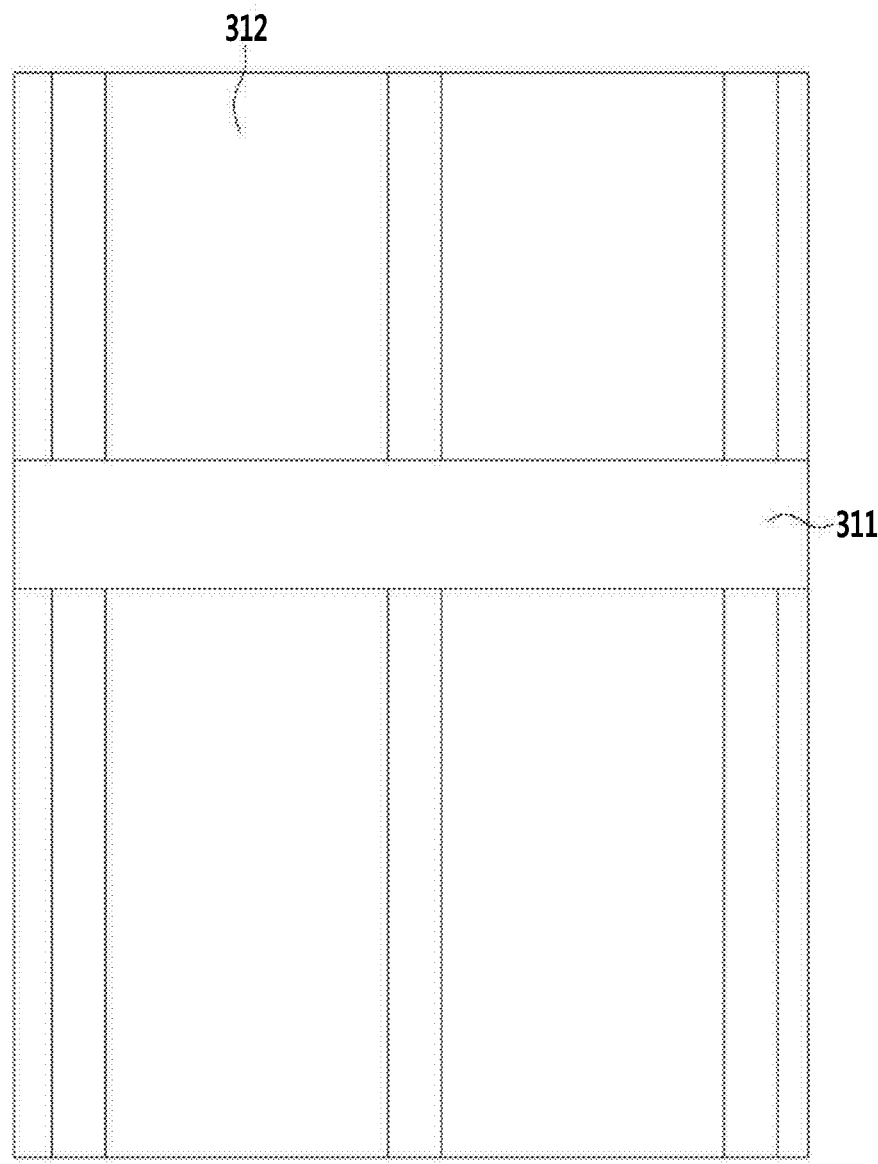
Figure 8B:
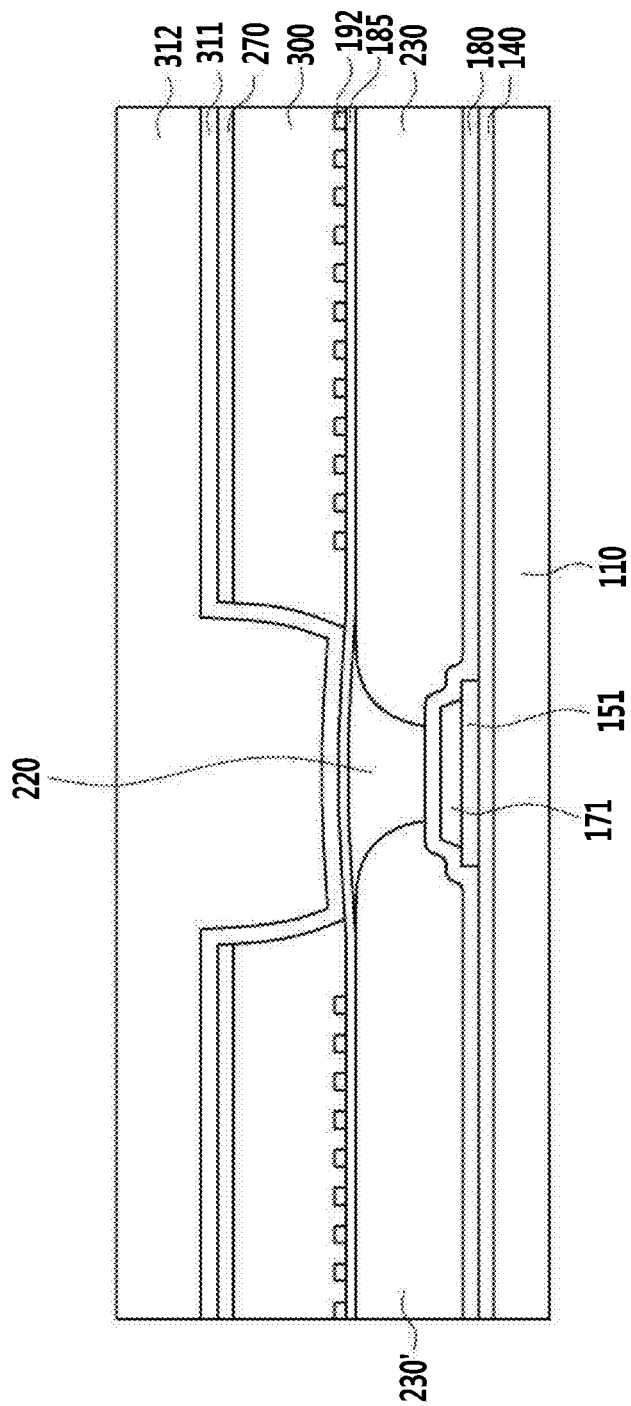
Figure 8C:
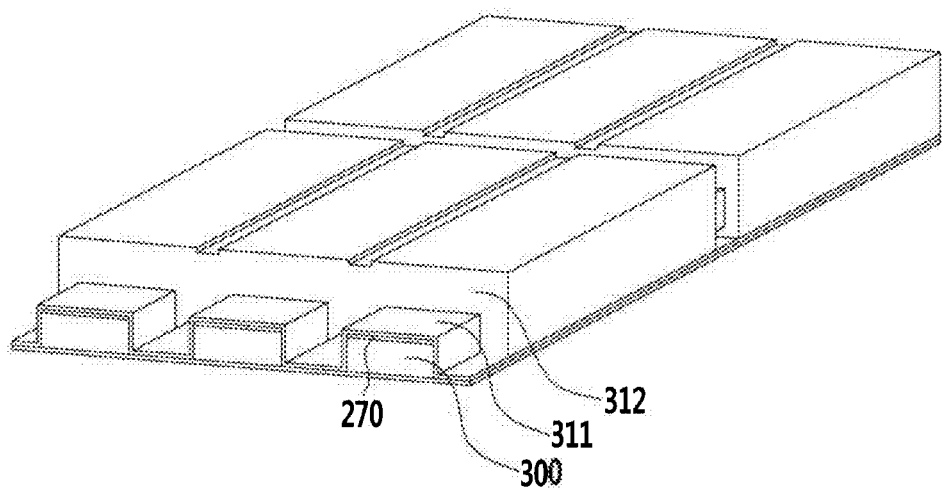

Next, as illustrated in FIG. 8A to FIG. 8C, a loop layer 312 is formed. The loop layer 312 may include an organic material, and the loop layer 312 is not formed in a region (hereinafter referred to as a 'liquid crystal injection hole open region') etched during a process of forming the liquid crystal injection hole 335. In FIG. 8A, the liquid crystal injection hole open region is formed to correspond to a thin film transistor formation region and has a structure extending in a formation direction of the gate line. Further, since the loop layer 312 is not formed in the corresponding region, FIG. 8A to FIG. 8C indirectly illustrate that the lower insulating layer 311 which is entirely formed is exposed by referring to the reference numeral.

The loop layer 312 is formed by laminating a material for forming the loop layer including an organic material on the entire region of the panel, exposing and developing the laminated material by using it as a mask, and then removing the material for forming the loop layer in the region corresponding to the liquid crystal injection hole open region. The lower insulating layer 311 formed below the loop layer 312 is not etched but is exposed. In the liquid crystal injection hole open region, only the sacrificial layer 300, the common electrode 270, and the lower insulating layer 311 are formed, and in other regions, the sacrificial layer 300 or the opening 301, the common electrode 270, the lower insulating layer 311, and the loop layer 312 are laminated.

Figure 9A:
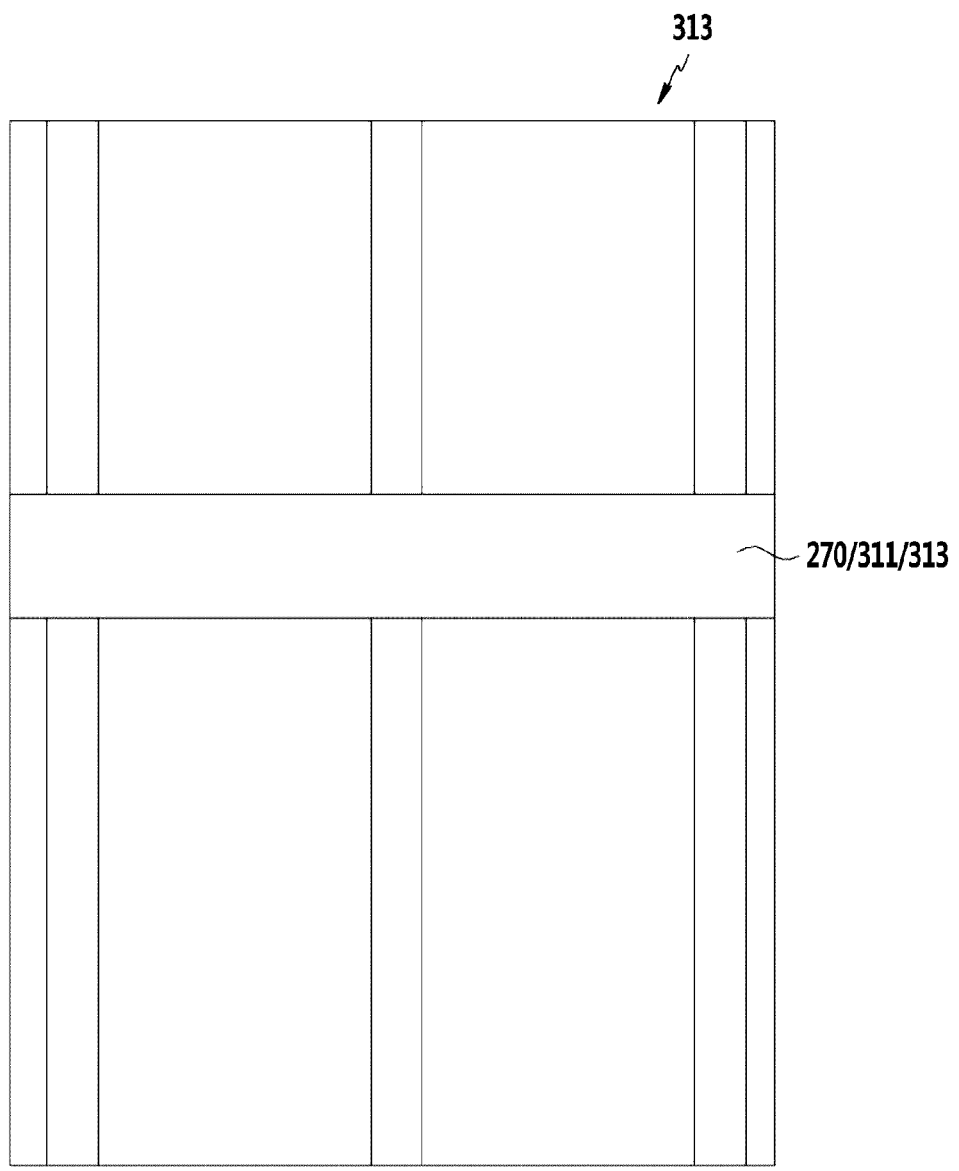
Figure 9B:
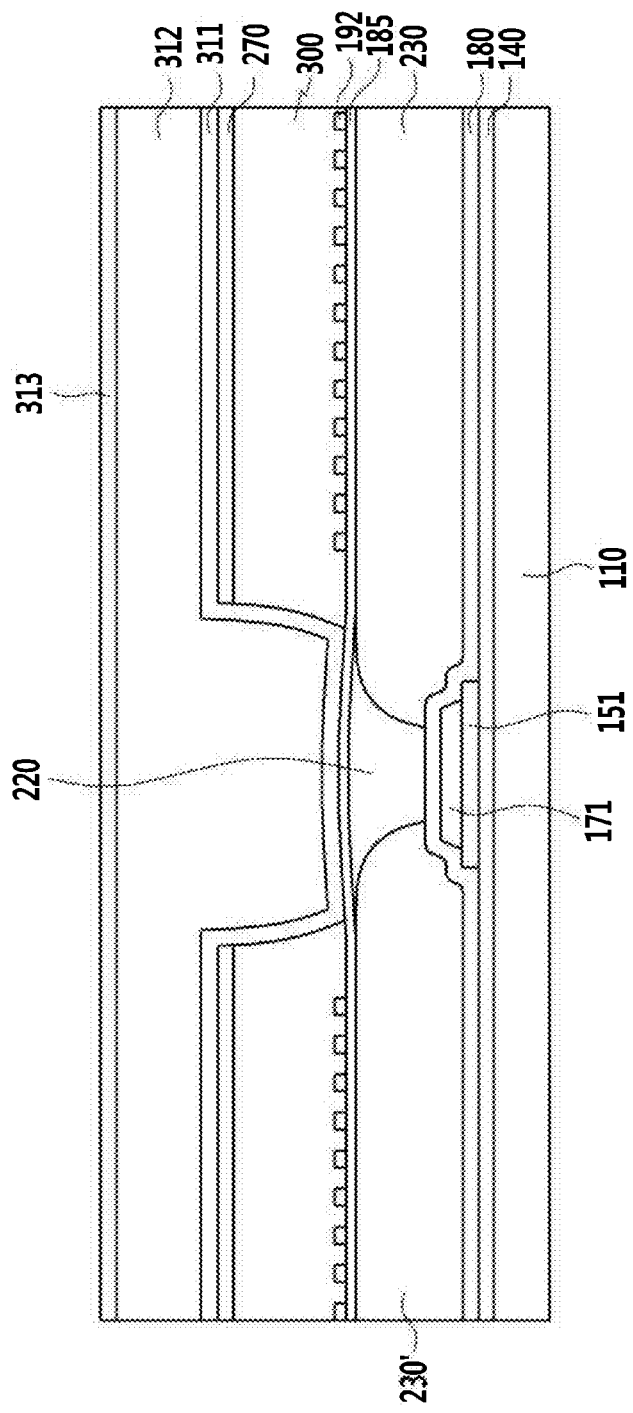
Figure 9C:
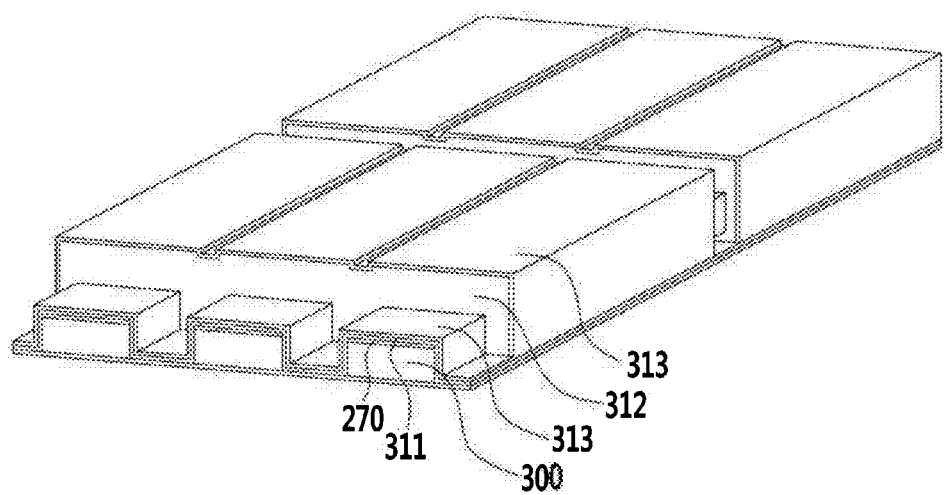

Next, as illustrated in FIG. 9A to FIG. 9C, a material for an upper insulating layer including an inorganic insulating material such as, for example, a silicon nitride (SiNx), is laminated to form the upper insulating layer 313 on the entire surface of the liquid crystal panel.

Next, as illustrated in FIG. 10A to FIG. 10D, the liquid crystal injection hole 335 is formed by etching the liquid crystal injection hole open region.

Figure 10A:
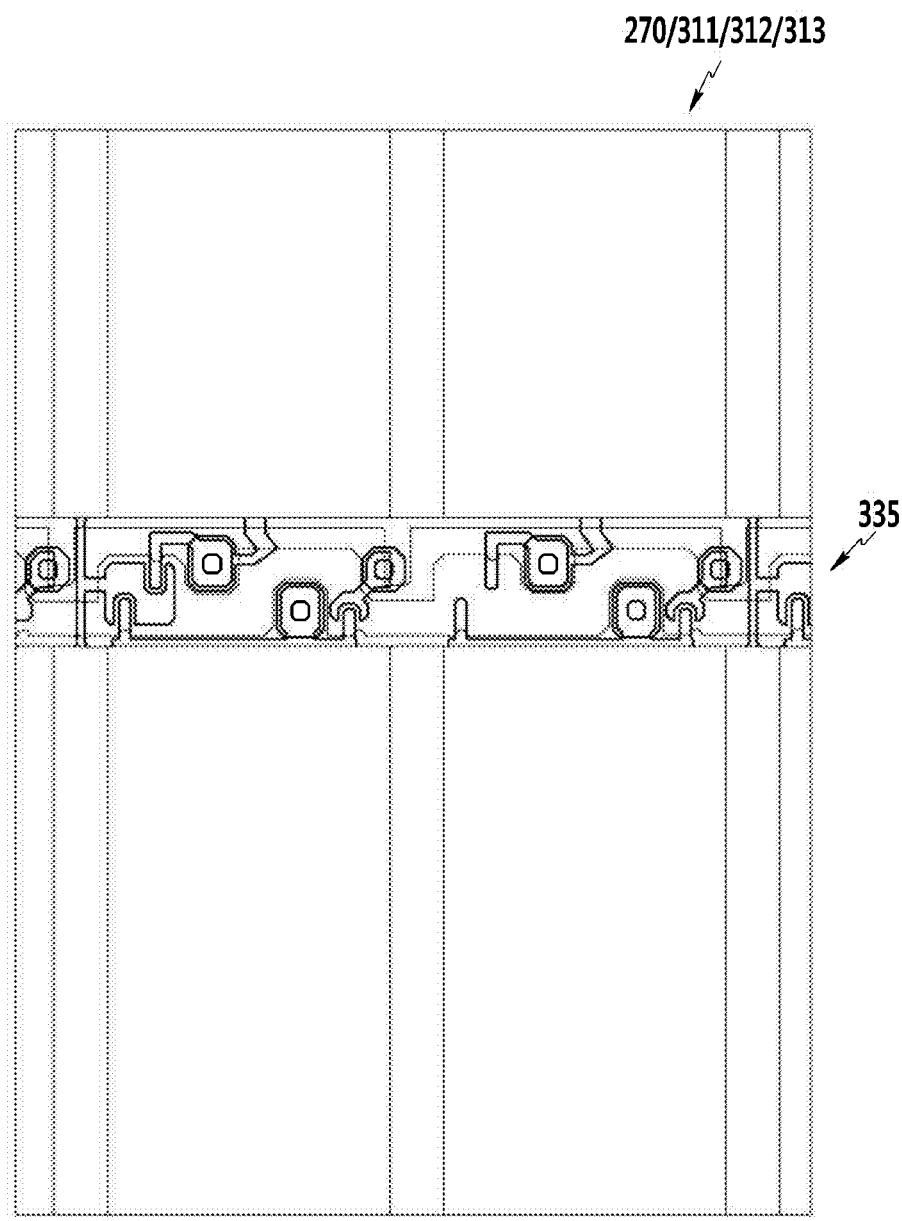
Figure 10B:
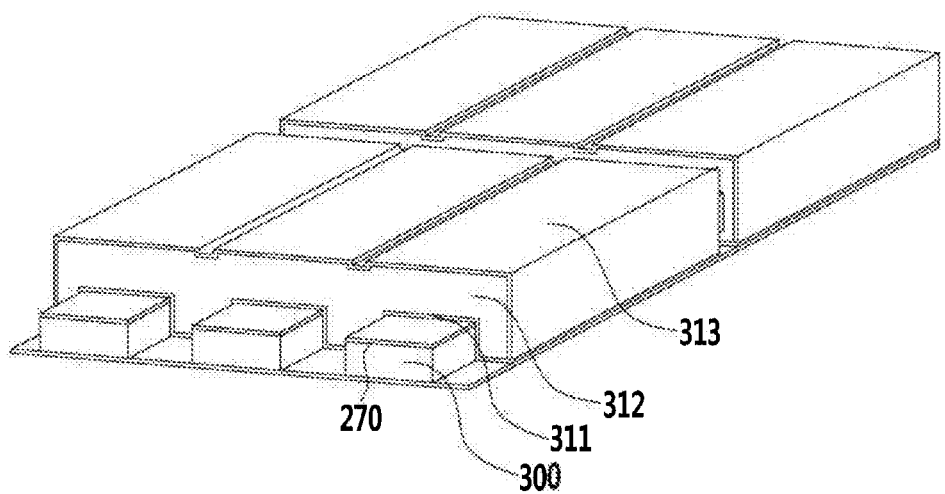

As illustrated in FIG. 10B, the common electrode 270 remains by etching the lower insulating layer 311 and the upper insulating layer 313 formed in the liquid crystal injection hole open region of the upper insulating layer 313 and the lower insulating layer 311 laminated all over the entire region of the display panel including an inorganic insulating material such as, for example, a silicon nitride (SiNx).

Figure 10C:
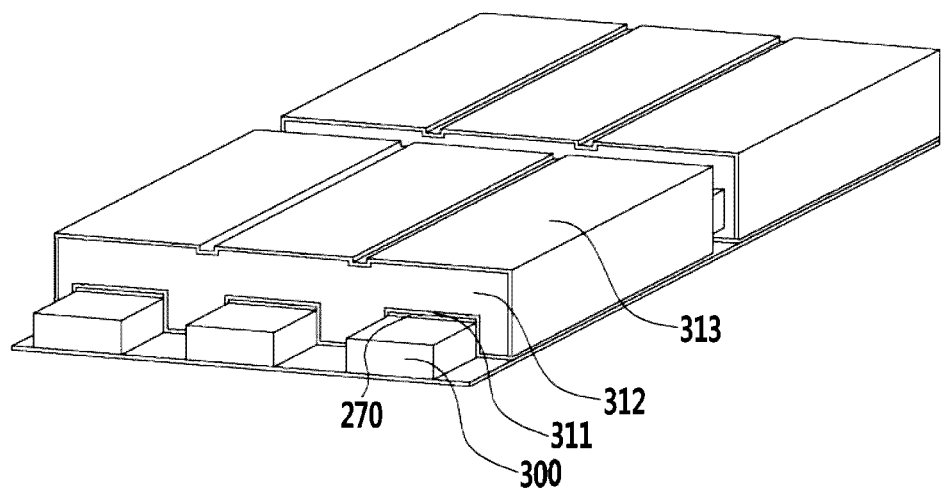

Next, as illustrated in FIG. 10C, the common electrode 270 formed in the liquid crystal injection hole open region is etched to expose the sacrificial layer 300. In one embodiment, a part of the common electrode 270 remains to electrically connect the adjacent common electrodes 270 to each other.

In order to etch the liquid crystal injection hole open region, the photoresist PR is formed in the entire region, the photoresist PR corresponding to the liquid crystal injection hole open region is removed to form the photoresist pattern, and thereafter, is etched according to the photoresist pattern to etch the liquid crystal injection hole open region. In the etched layer in the liquid crystal injection hole open region, the material 313 for the upper insulating layer, the lower insulating layer 311, the common electrode 270, and the sacrificial layer 300 are etched and the layer therebelow is not etched. In accordance with another embodiment, the sacrificial layer 300 may be partially etched or not etched at all. The process of etching the liquid crystal injection hole open region may be performed by dry etching, and in the case of an etchant that may etch the etching layer together, the process may be performed by wet etching.

Figure 10D:
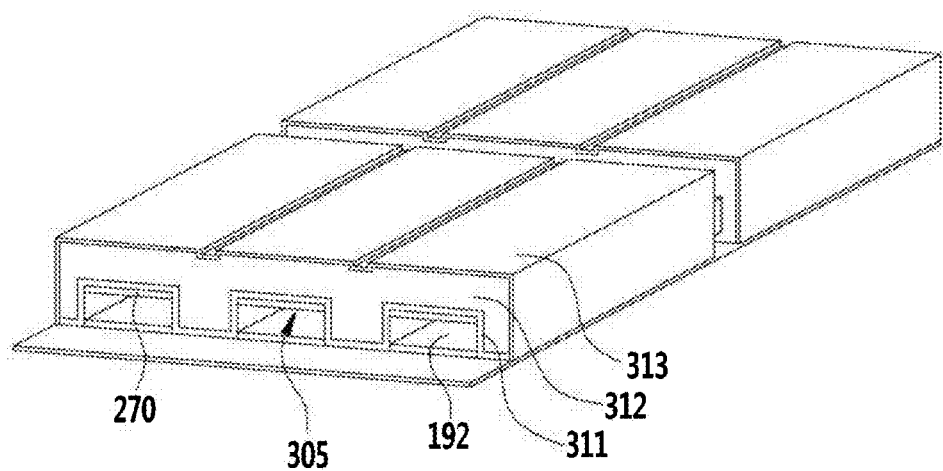

Next, as illustrated in FIG. 10D, the exposed sacrificial layer 300 is removed. In one embodiment, since the sacrificial layer 300 is includes the photoresist PR, a process of removing the photoresist pattern formed on the upper insulating layer 313 may be performed together. The photoresist pattern formed on the upper insulating layer 313 may be wet-etched together with the sacrificial layer 300 by immersing in an etchant (for example, a photoresist stripper) for removing the photoresist pattern. Further, the sacrificial layer 300 may be formed by dry etching, not wet etching.

Thereafter, an alignment layer (not illustrated) or a liquid crystal layer 3 is injected into the microcavity 305 by using capillary force.

Next, although not illustrated, a capping layer (not illustrated) is formed in order to prevent the liquid crystal layer 3 injected into the microcavity 305 from being leaked outside and then a process of sealing the microcavity 305 may be performed.

In accordance with another embodiment, the lower insulating layer 311 and the upper insulating layer 313 may be omitted.

Further, a process of attaching a polarizer (not illustrated) below the insulation substrate 110 and on the upper insulating layer 313 may be further included. The polarizer may include a polarized element generating polarization and a tri-acetyl-cellulose (TAC) layer for ensuring durability, and according to an embodiment, directions in transmissive axes of an upper polarizer and a lower polarizer may be perpendicular or parallel to each other.

According to an embodiment of the manufacturing method, the sacrificial layer 300 is etched at the upper portion to have a sharp side wall and thus the side wall of the microcavity 305 is sharp. The liquid crystal layer 3 injected in the microcavity 305 does not have a sufficient cell gap at the side wall and thus a light leakage phenomenon occurs. In one embodiment, since the side wall is sharp, the horizontal area is narrow and thus a wide opening area may be ensured.

Hereinafter, an embodiment of the liquid crystal display is described with reference to FIG. 11 to FIG. 13.

Figure 11:
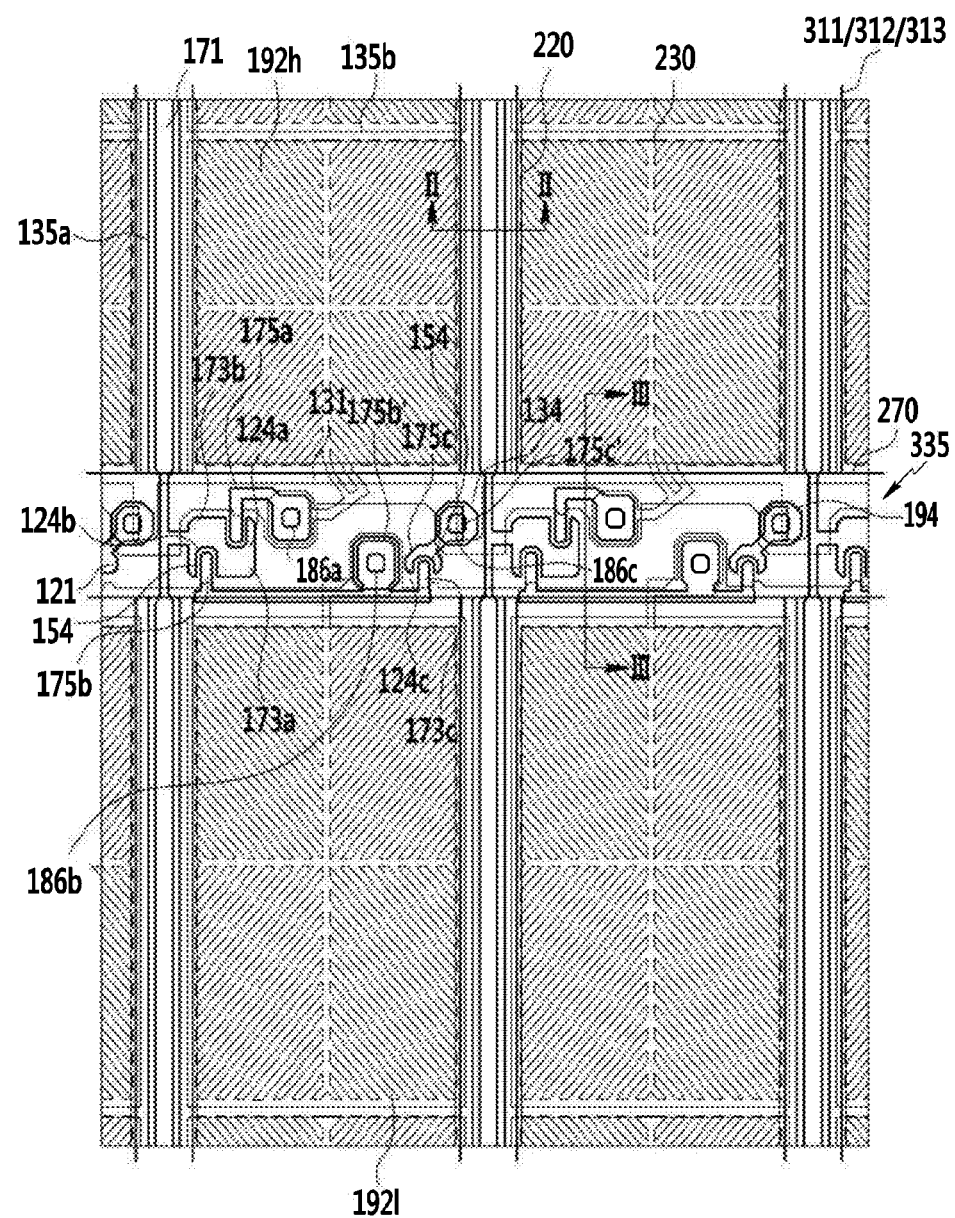
FIG. 11 is a layout view of the liquid crystal display in accordance with an embodiment.
Figure 12:
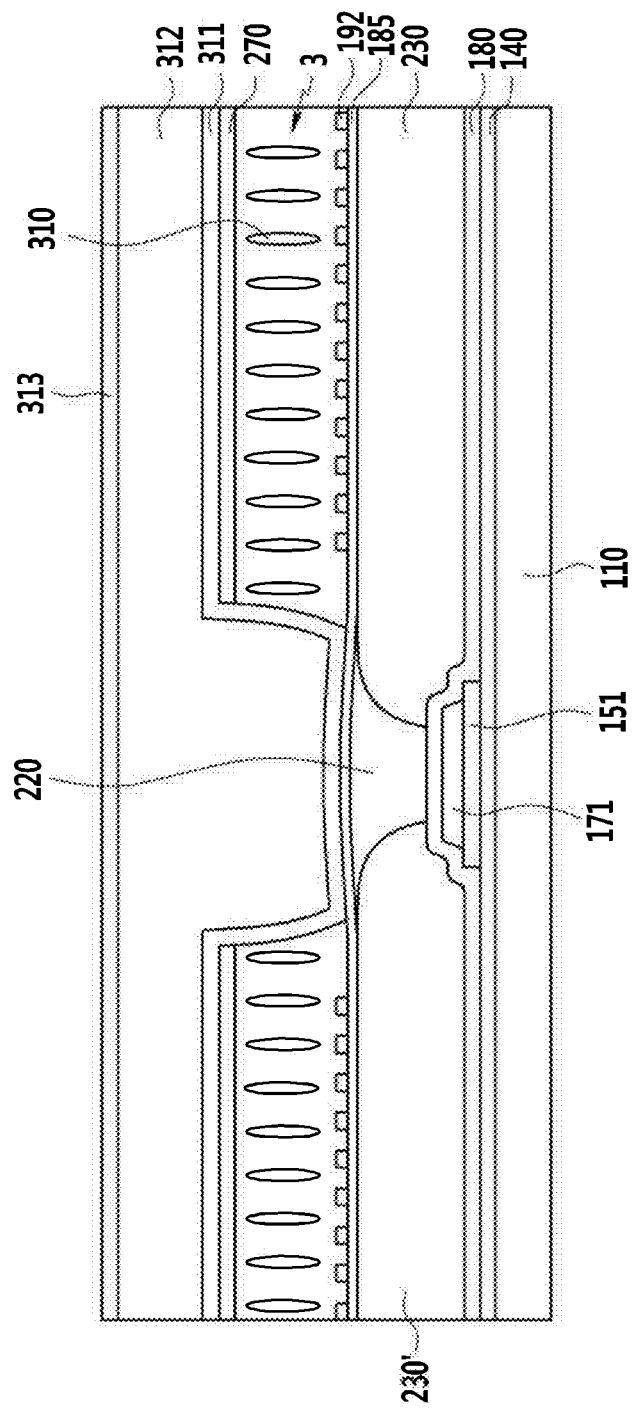
FIG. 12 is a cross-sectional view of FIG. 11 taken along a line II-II.
Figure 13:
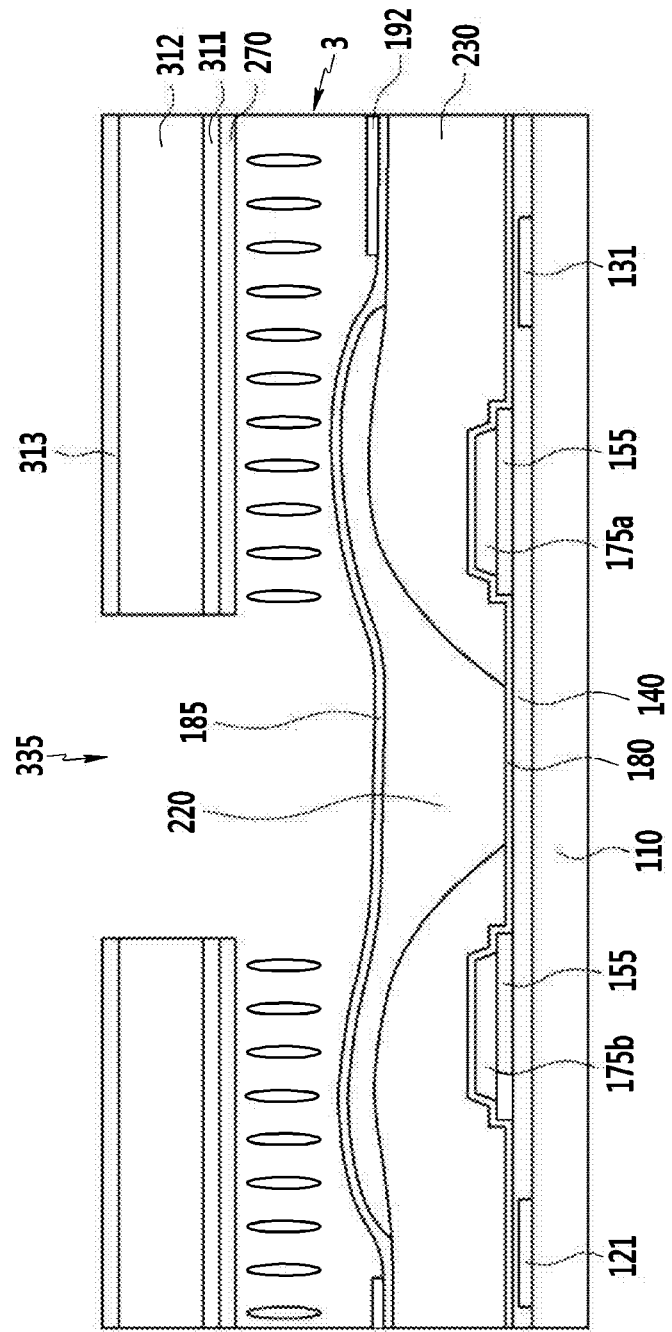
FIG. 13 is a cross-sectional view of FIG. 11 taken along a line III-III.

FIG. 11 is a layout view of an embodiment of the liquid crystal display, FIG. 12 is a cross-sectional view of FIG. 11 taken along a line II-II, and FIG. 13 is a cross-sectional view of FIG. 11 taken along a line III-III.

The gate line 121 and the storage voltage line 131 are formed on an insulation substrate 110 made of transparent glass, plastic, or the like. The gate line 121 includes a first gate electrode 124a, a second gate electrode 124b, and a third gate electrode 124c. The storage voltage line 131 includes storage electrodes 135a and 135b and a protrusion 134 protruding in a direction of the gate line 121. The storage electrodes 135a and 135b have a structure surrounding a first subpixel electrode 192h and a second subpixel electrode 192l of a front pixel. A horizontal portion 135b of the storage electrode of FIG. 11 may be one wire which is not separated from the horizontal portion 135b of the front pixel.

A gate insulating layer 140 is formed on the gate line 121 and the storage voltage line 131. A semiconductor 151 positioned below a data line 171, a semiconductor 155 positioned below a source/drain electrode, and a semiconductor 154 positioned at a channel part of a thin film transistor are formed on the gate insulating layer 140.

A plurality of ohmic contacts may be formed on the respective semiconductors 151, 154, and 155 and between the data line 171 and the source/drain electrode, and are omitted in the drawings.

On the respective semiconductors 151, 154, and 155 and the gate insulating layer 140, a data conductor (171, 173c, 175a, 175b, and 175c) that includes a plurality of data lines 171 including a first source electrode 173a and a second source electrode 173b, a first drain electrode 175a, a second drain electrode 175b, a third source electrode 173c, and a third drain electrode 175c is formed.

The first gate electrode 124a, the first source electrode 173a, and the first drain electrode 175a form a first thin film transistor Qa together with the semiconductor 154, and a channel of the thin film transistor is formed at the semiconductor portion 154 between the first source electrode 173a and the first drain electrode 175a. Similarly, the second gate electrode 124b, the second source electrode 173b, and the second drain electrode 175b form a second thin film transistor Qb together with the semiconductor 154, and a channel of the thin film transistor is formed at the semiconductor portion 154 between the second source electrode 173b and the second drain electrode 175b. The third gate electrode 124c, the third source electrode 173c, and the third drain electrode 175c form a third thin film transistor Qc together with the semiconductor 154, and a channel of the thin film transistor is formed at the semiconductor portion 154 between the third source electrode 173c and the third drain electrode 175c.

The data line 171 has a structure with a narrow width in a thin film transistor formation region around an extension 175c' of the third drain electrode 175c. This structure is for keeping a distance from an adjacent wire and reducing signal interference, but does not necessarily need to be formed like this.

A first passivation layer 180 is formed on the data conductor (171, 173c, 175a, 175b, and 175c) and the exposed portion of the semiconductor 154. The first passivation layer 180 may include an inorganic insulator such as, for example, a silicon nitride (SiNx) and a silicon oxide (SiOx) or an organic insulator.

A color filter 230 is formed on the passivation layer 180. Color filters 230 having the same color are formed in adjacent pixels in a vertical direction (data line direction). Further, adjacent pixels in a horizontal direction (gate line direction) have color filters 230 and 230' having different colors, and two color filters 230 and 230' may be overlapped with each other on the data line 171. The color filters 230 and 230' may display one color of primary colors such as, for example, three primary colors of red, green, and blue. However, the color is not limited to the three primary colors of red, green, and blue, and the color filters 230 and 230' may display one color of cyan, magenta, yellow, and white, or other colors.

A black matrix 220 is formed on the color filters 230 and 230'. The black matrix 220 is formed based on a region (hereinafter referred to as a 'transistor formation region') where the gate line 121, the storage voltage line 131, and the thin film transistor are formed, and a region where the data line 171 is formed and has a lattice structure having openings corresponding to a region displaying images. The color filter 230 is formed in the opening of the black matrix 220. Further, the black matrix 220 includes a material which does not transmit light.

A second passivation layer 185 covering the color filter 230 and the black matrix 220 is formed on the color filter 230 and the black matrix 220. The second passivation layer 185 may include an inorganic insulator such as, for example, a silicon nitride (SiNx) and a silicon oxide (SiOx), or an organic insulator. Unlike those illustrated in cross-sectional views of FIG. 12 and FIG. 13, in the case where a step occurs due to a thickness difference between the color filter 230 and the black matrix 220, the second passivation layer 185 includes the organic insulator to reduce or remove the step.

A first contact hole 186a and a second contact hole 186b which expose the first drain electrode 175a and an extension 175b' of the second drain electrode 175b, respectively, are formed in the color filter 230, the black matrix 220, and the passivation layers 180 and 185. Further, a third contact hole 186c which exposes a protrusion 134 of the storage voltage line 131 and an extension 175c' of the third drain electrode 175c is formed in the color filter 230, the black matrix 220, and the passivation layers 180 and 185.

In one embodiment, the contact holes 186a, 186b, and 186c are formed even in the black matrix 220 and the color filter 230, but the black matrix 220 and the color filter 230 may be difficult to etch the contact holes as compared with the passivation layers 180 and 185 according to a material. Therefore, the black matrix 220 or the color filter 230 may be formed at the position where the contact holes 186a, 186b, and 186c are formed in advance during etching of the black matrix 220 or the color filter 230.

In another embodiment, only the color filter 230 and the passivation layers 180 and 185 are etched by changing a position of the black matrix 220 to form the contact holes 186a, 186b, and 186c.

A pixel electrode 192 including the first subpixel electrode 192h and the second subpixel electrode 192l is formed on the second passivation layer 185. The pixel electrode 192 may include a transparent conductive material such as, for example, ITO or IZO.

The first subpixel electrode 192h and the second subpixel electrode 192l are adjacent to each other in a column direction, have an overall quadrangular shape, and include a cross stem configured by a horizontal stem and a vertical stem crossing the horizontal stem. Further, the first subpixel electrode 192h and the second subpixel electrode 192l are divided into four subregions by the horizontal stem and the vertical stem, and each subregion includes a plurality of minute branches.

The minute branches of the first subpixel electrode 192h and the second subpixel electrode 192l form an angle of approximately 40 to 45 degrees with the gate line 121 or the horizontal stem. Further, the minute branches of two adjacent subregions may be perpendicular to each other. A width of the minute branch may be gradually increased, or distances between the minute branches may be different from each other.

The first subpixel electrode 192h and the second subpixel electrode 192l are physically and electrically connected with the first drain electrode 175a and the second drain electrode 175b through the contact holes 186a and 186b and receive data voltages from the first drain electrode 175a and the second drain electrode 175b.

A connector 194 electrically connects the extension 175c' of the third drain electrode 175c and the protrusion 134 of the storage voltage line 131 through the third contact hole 186c. As a result, a part of the data voltage applied to the second drain electrode 175b is divided through the third source electrode 173c, and a magnitude of the voltage applied to the second subpixel electrode 192l may be smaller than a magnitude of the voltage applied to the first subpixel electrode 192h.

An area of the second subpixel electrode 192l may be about 1 to 2 times larger than an area of the first subpixel electrode 192h.

An opening which may collect gas discharged from the color filter 230, and a cover which covers the corresponding opening with the same material as the pixel electrode 192 thereon may be formed in the second passivation layer 185. The opening and the cover are structures for preventing gas discharged from the color filter 230 from being transferred to other elements, and may be omitted in some embodiments.

A common electrode 270 is positioned on the second passivation layer 185 and the pixel electrode 192 and above the liquid crystal layer 3 injected in a microcavity 305 (see FIG. 10D and FIG. 10E). The common electrode 270 is formed only at a flat portion above the microcavity 305 or the liquid crystal layer 3, and is formed only at a portion corresponding to the portion with the pixel electrode 192. Since the common electrode 270 is not positioned at the side of the microcavity 305 or the liquid crystal layer 3, a vertical electric field between the common electrode 270 and the pixel electrode 192 may be uniformly formed except for the outer portion, and thus there is an advantage in that distortion of the electric field is small. Further, the common electrode 270 may receive the common voltage Vcom from the outside through a separate constituent element, and the adjacent common electrodes 270 may be connected to each other through a transistor formation area (or around a liquid crystal injection hole 335). In this case, some of the common electrodes 270 remain at the liquid crystal injection hole 335 portion to have a structure in which the adjacent common electrodes 270 are connected to each other.

The reason that the common electrode 270 may be maintained level even on the microcavity is because a loop layer 312 supports the common electrode 270.

The common electrode 270 includes a transparent conductive material such as, for example, ITO or IZO, and serves to generate an electric field together with the pixel electrode 192 to control an alignment direction of the liquid crystal molecules 310.

A lower insulating layer 311 is positioned on the common electrode 270 and the second passivation layer 185 and the side of the liquid crystal layer 3 (or the side of the microcavity 305). The lower insulating layer 311 may have a liquid crystal injection hole 335 at one side thereof in order to fill the liquid crystal in the microcavity 305. The lower insulating layer 311 may include an inorganic insulating material such as, for example, a silicon nitride (SiNx). The liquid crystal injection hole 335 may be used when removing a sacrificial layer for forming the microcavity 305.

Further, a side wall of the microcavity 305 in which the liquid crystal layer 3 is injected is sharply formed and thus there is an advantage in that a horizontal width in a region where a cell gap of the liquid crystal layer 3 is not sufficient is largely decreased. The horizontal width occupied by the side wall of the microcavity 305 or the liquid crystal layer 3 is in a range of about 1 to 2 μm. As a result, a horizontal width covering the microcavity 305 or the liquid crystal layer 3 by the black matrix 220 may be in a range of about 1 to 2 μm.

Further, an alignment layer (not illustrated) may be formed in the microcavity 305 in order to align the liquid crystal molecules injected in the microcavity 305. The alignment layer may include at least one of polyamic acid, polysiloxane, or polyimide which are generally used as a liquid crystal alignment layer, or the like.

The liquid crystal layer 3 is formed in the microcavity 305 (in the alignment layer). The liquid crystal molecules 310 are initially aligned by the alignment layer and the alignment direction is changed according to the applied electric field. A height of the liquid crystal layer 3 corresponds to a height of the microcavity 305. The liquid crystal layer 3 positioned in the microcavity 305 is referred to as a nanocrystal layer.

The liquid crystal layer 3 formed in the microcavity 305 may be injected in the microcavity 305 by using capillary force, and the alignment layer may be formed by capillary force.

The loop layer 312 is formed on the lower insulating layer 311. The loop layer 312 may serve to support a space between the pixel electrode 192 and the common electrode 270 (the microcavity) where the nanocrystal layer is to be formed. The loop layer 312 serves to support the microcavity 305 above the common electrode 270 at a predetermined thickness, and may have the liquid crystal injection hole 335 at one side so as to fill the liquid crystal in the microcavity 305.

An upper insulating layer 313 is formed on the loop layer 312. The upper insulating layer 313 may include an inorganic insulating material such as, for example, a silicon nitride (SiNx). The loop layer 312 and the upper insulating layer 313 are patterned together with the lower insulating layer 311 to form the liquid crystal injection hole 335.

In another embodiment, the lower insulating layer 311 and the upper insulating layer 313 may be omitted.

A capping layer (not illustrated) is formed on the upper insulating layer 313 to prevent the liquid crystal molecules 310 from be discharged outside through the liquid crystal injection hole 335.

A polarizer (not illustrated) is positioned below the insulation substrate 110 and above the upper insulating layer 313 (or above the capping layer). The polarizer may include a polarized element generating polarization and a tri-acetyl-cellulose (TAC) layer for ensuring durability, and according to an embodiment, directions in transmissive axes of an upper polarizer and a lower polarizer may be perpendicular or parallel to each other.

Horizontal areas of sidewalls of nanocrystal display devices in accordance with a test example and a comparative example in one embodiment will be described by comparing their cross-sections with reference to FIG. 14 and FIG. 15.

Figure 14:
FIGS. 14 and 15 are photographs comparing cross-sections of liquid crystal displays according to a test example and a comparative example in an embodiment.
Figure 15:
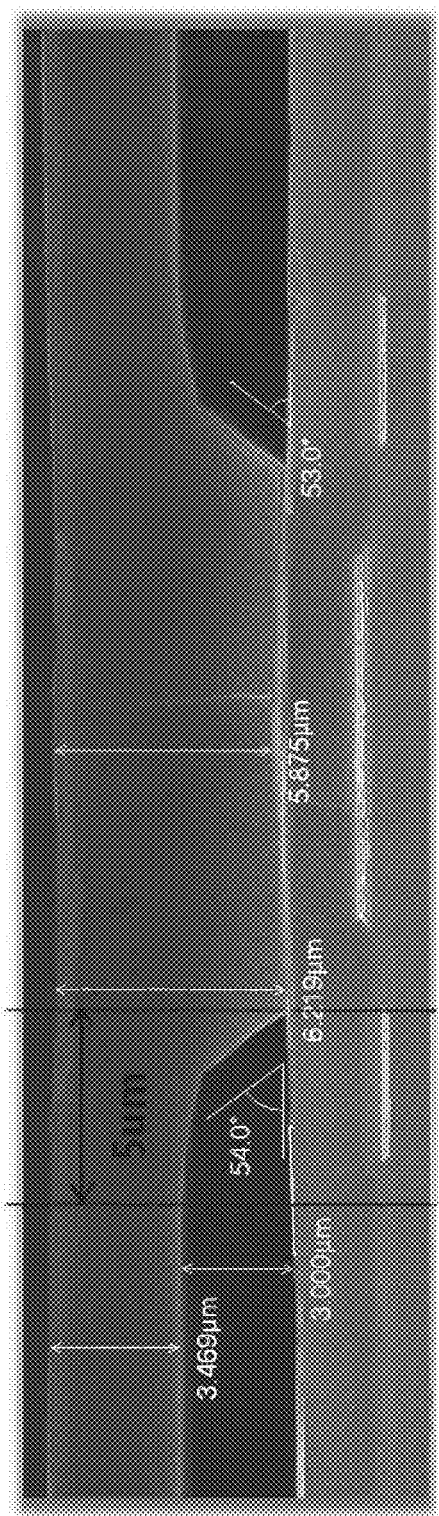

FIGS. 14 and 15 are photographs comparing cross-sections of the liquid crystal displays in accordance with the test example and the comparative example of an embodiment, wherein FIG. 14 is a cross-sectional view of the liquid crystal display in accordance with the test example, and FIG. 15 is a cross-sectional view of the liquid crystal display in accordance with the comparative example.

As shown in FIG. 14, in the test example, since the sidewall of the sacrificial layer 300 is steep, a horizontal width thereof is about 1 μm. Accordingly, a width of only 1 μm should be further covered in addition to the width of the portion covered by the light blocking member 220. As a result, the remaining portion of the sacrificial layer 300 can be used as an opening.

In the comparative example, the sacrificial layer 300 including the photoresist PR was stacked, exposed, and developed to form a pattern of the sacrificial layer 300. In this case, the sacrificial layer 300 has a taper shape. Accordingly, since a region corresponding to the sidewall of the sacrificial layer 300 has a horizontal width of about 5 μm as shown in FIG. 15, more area should be covered by the light blocking member 220 than that in the test example of FIG. 14. As a result, the wider opening can be obtained in accordance with the test example.

According to an embodiment of the manufacturing method of the liquid crystal display, a test for checking whether a bubble is generated in the sacrificial layer 300 by an out gas generated from the sacrificial layer 300 was performed when the sacrificial layer includes the non-photosensitive resin. The hard bake was performed on the sacrificial layer 300 including the non-photosensitive resin at the temperature of about 135° C. and 150° C. for 180 seconds as a test example, while the hard bake was performed on the sacrificial layer 300 made of the non-photosensitive resin at the temperature of about 140° C. and 150° C. for 110 seconds and 180 seconds, respectively. These results are shown in FIG. 16A to FIG. 17.

Figure 16A:
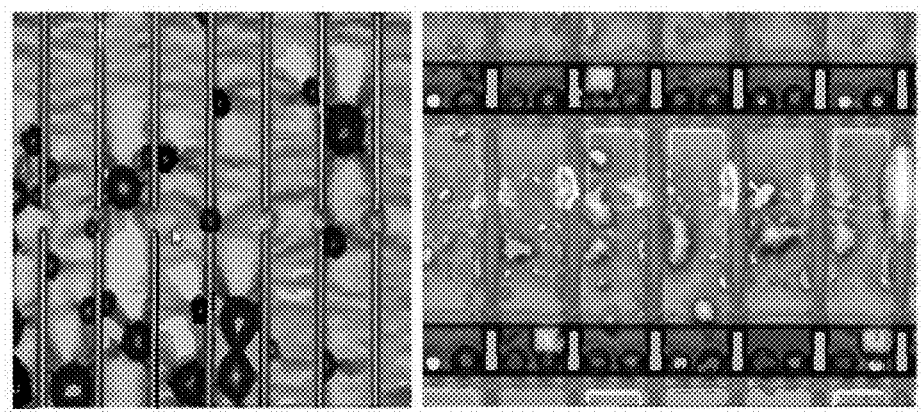
FIG. 16A and FIG. 16B are photographs showing a test result of measuring whether a bubble is generated at a sacrificial layer according to a manufacturing method of a liquid crystal display in accordance with a test example and a comparative example in an embodiment.
Figure 16B:
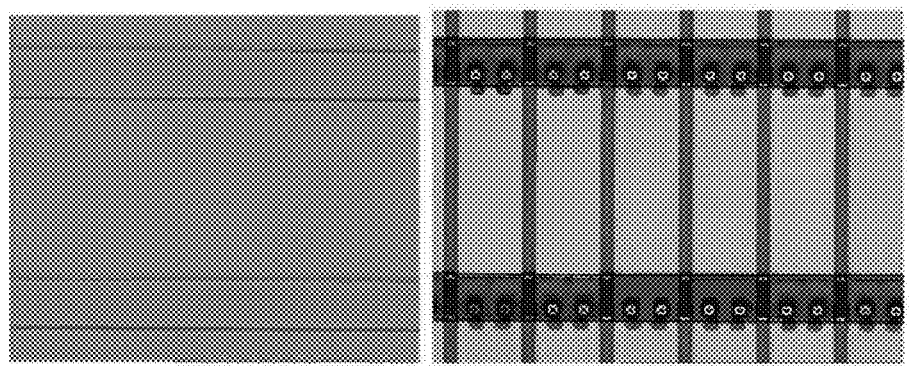

FIG. 16A shows photographs for measuring whether the bubble is generated in the sacrificial layer including the photosensitive resin, in which the left photograph shows the result in the case of performing the hard bake at the temperature of 140° C. for 110 seconds, and the right photograph shows the result in the case of performing the hard bake at the temperature of 150° C. for 180 seconds. FIG. 16B shows photographs for measuring whether the bubble is generated in the sacrificial layer including the non-photosensitive resin, in which the left photograph shows the result in the case of performing the hard bake at the temperature of 135° C. for 180 seconds, and the right photograph shows the result in the case of performing the hard bake at the temperature of 150° C. for 180 seconds.

Figure 17:
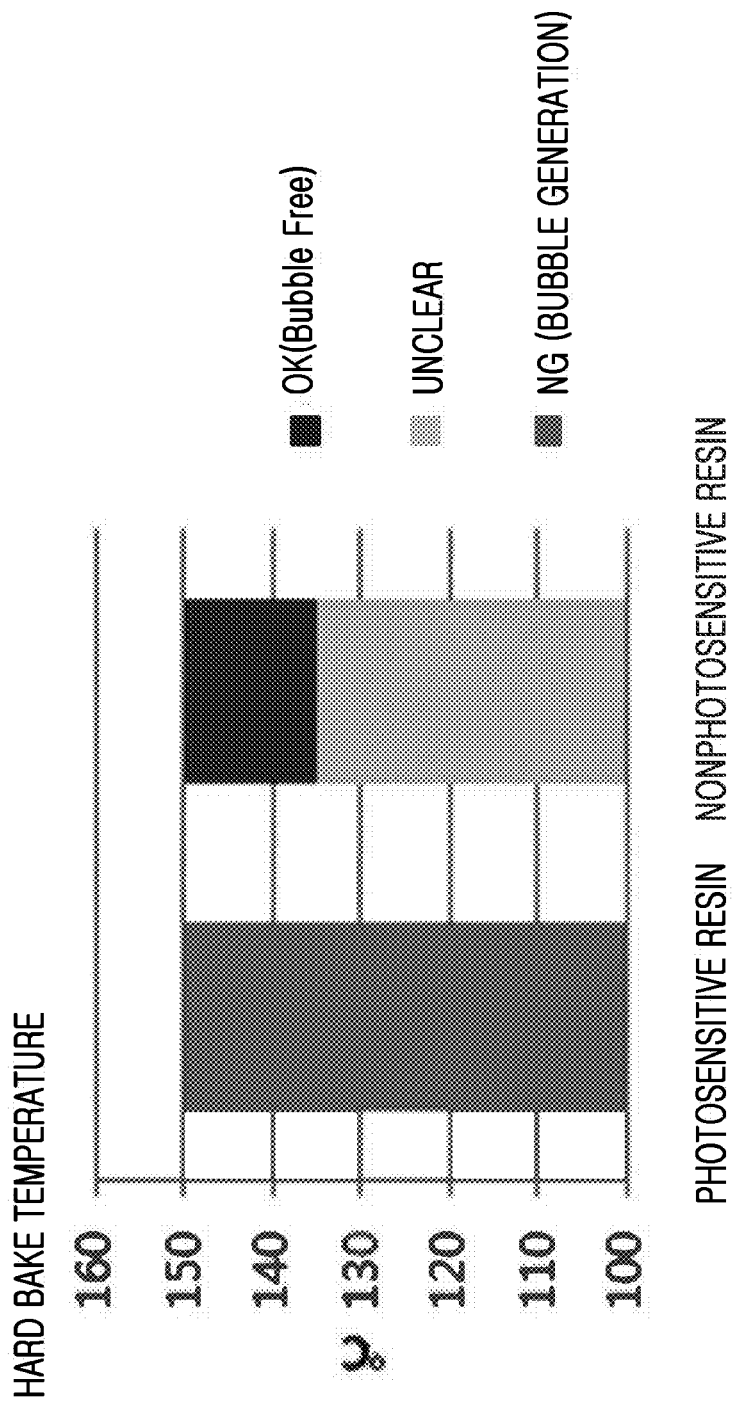
FIG. 17 is a graph showing the test result of measuring whether the bubble is generated at the sacrificial layer according to the manufacturing method of the liquid crystal display in accordance with the test example and the comparative example in an embodiment.

FIG. 17 shows whether the bubbles are generated in the sacrificial layer which is subjected to the hard bake according to various temperature conditions.

As shown in FIG. 16A, many bubbles were generated in the sacrificial layer including the photosensitive resin after the hard bake was performed. In contrast, referring to FIG. 16B, no bubbles were generated in the sacrificial layer including the non-photosensitive resin after the hard bake was performed.

Referring to FIG. 17, when the hard bake is performed on the sacrificial layer according to various temperature conditions, bubbles were generated in the sacrificial layer including the photosensitive resin after the hard bake, while no bubbles were generated in the sacrificial layer including the non-photosensitive resin.

Hereinafter, a liquid crystal display in accordance with modifications of an embodiment will be described with reference to FIG. 18 to FIG. 21.

FIG. 18 to FIG. 21 show the liquid crystal display in accordance with modifications of an embodiment.

First, a first modification of FIG. 16 will be described.

Figure 18:
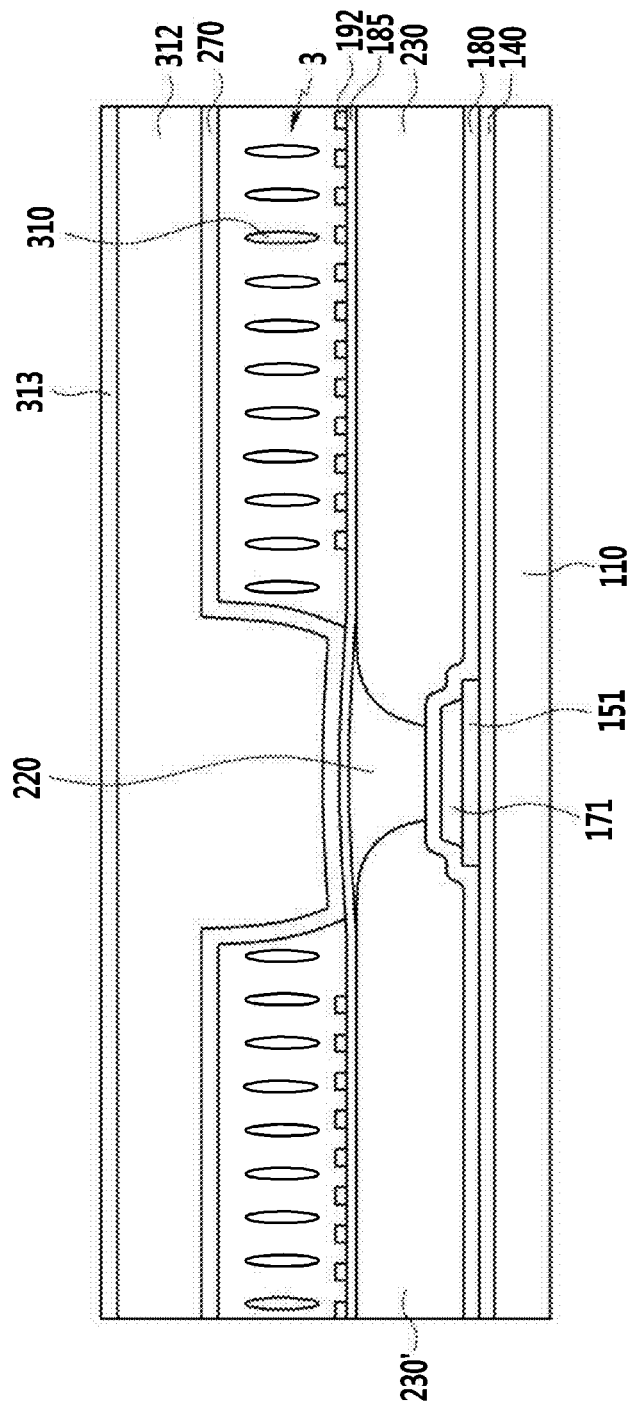
FIG. 18 to FIG. 21 show a liquid crystal display in accordance with modifications of an embodiment.

FIG. 18 is a cross-sectional view of the liquid crystal display in accordance with the first modification of an embodiment, and corresponds to FIG. 12.

In the first modification, the lower insulating layer 311 is omitted, and the common electrode 270 is formed at the sacrificial layer 300, the microcavity 305, or the side wall of the liquid crystal layer 3 unlike the embodiment of FIG. 12.

In the first modification, after the etch stop layer used when the sacrificial layer 300 is etched is removed, the common electrode 270 is formed on the side wall. The common electrode 270 is positioned at the flat portion of the microcavity 305 or the liquid crystal layer 3 and on the side wall of the microcavity 305 or the liquid crystal layer 3.

As such, in the first modification, when the sacrificial layer 300 including the non-photosensitive resin is etched by ashing, a separate layer (which may include a transparent conductive material such as, for example, ITO and IZO or an insulating material such as, for example, SiNx and SiOx) is formed as the etch stop layer preventing etching and the sacrificial layer 300 is completed, and then the etch stop layer is removed and the common electrode 270 is formed thereon.

In accordance with another embodiment, when the transparent conductive material such as for example ITO and IZO is used as the etch stop layer, the etch stop layer is not removed and the same transparent conductive material is laminated on the entire surface thereof to form the common electrode 270.

Figure 19:
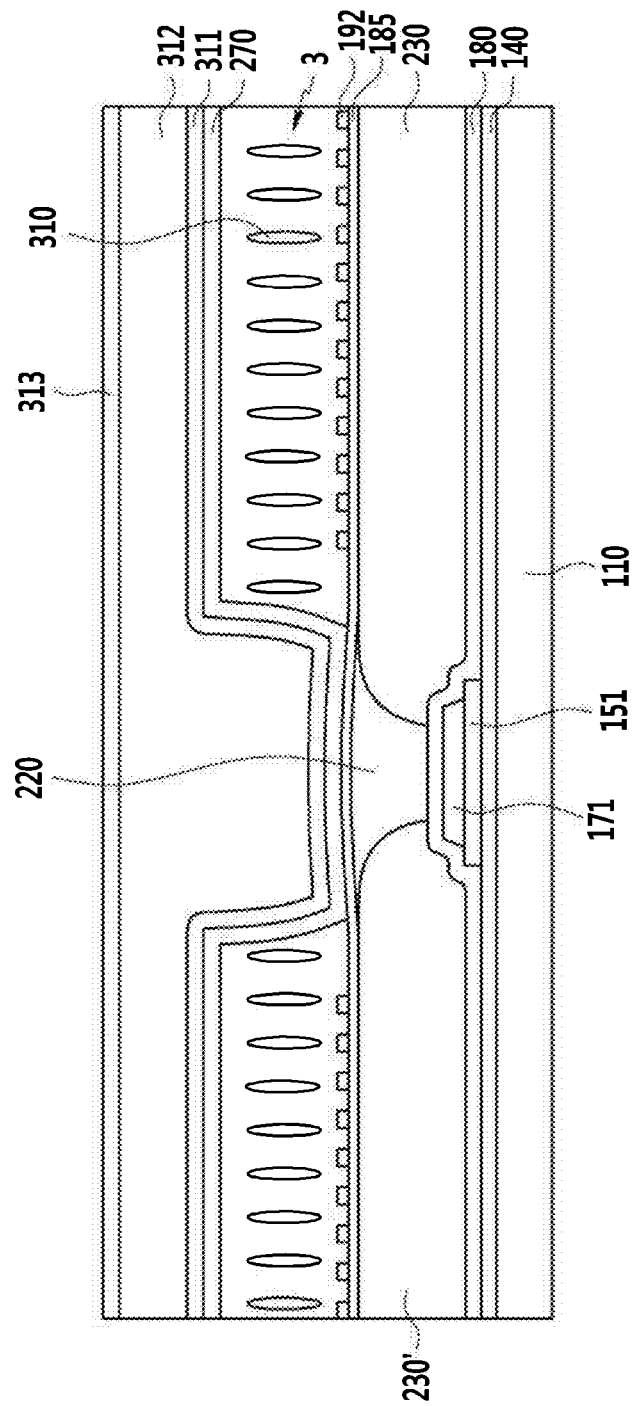

In a second modification, unlike the first modification, the lower insulating layer 311 is formed all over the upper portion of the common electrode 270. In FIG. 19, the only difference is that the lower insulating layer 311 is additionally formed.

Figure 20:
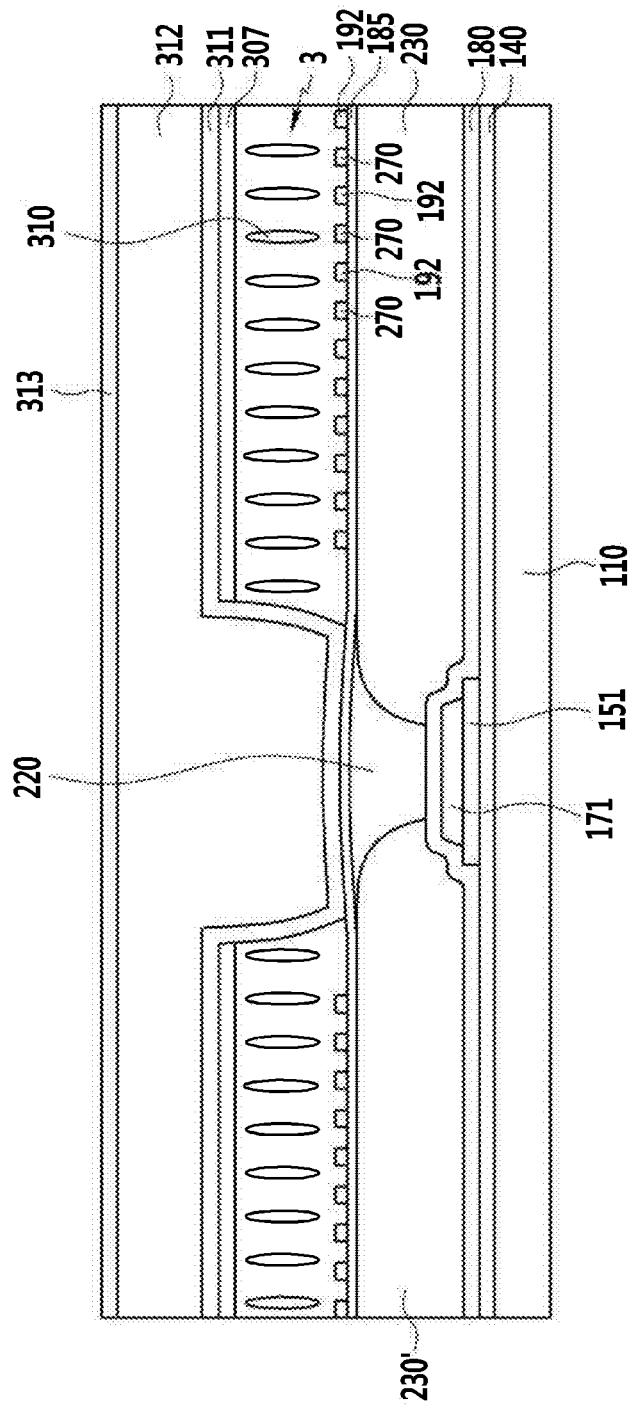
Figure 21:
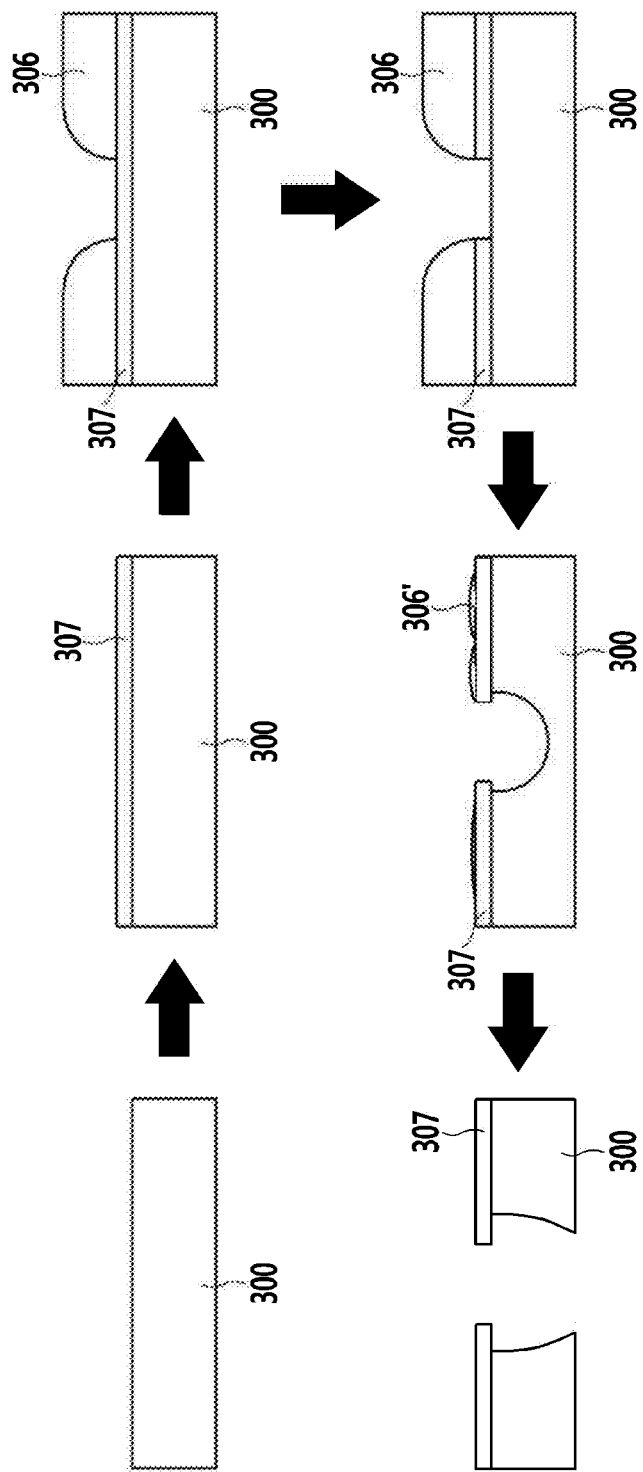

In FIG. 20 and FIG. 21, the common electrode 270 is not formed above the liquid crystal layer 3, but the common electrode 270 and the pixel electrode 192 are alternately formed on the same layer as the pixel electrode 192. Further, instead of the transparent conductive material used as the etch stop layer, the insulating material such as for example SiNx or SiOx is used as an etch stop layer 307.

In FIG. 20, the common electrode 270 is positioned between the pixel electrodes 192, and further, the etch stop layer 307 is positioned at the position of the common electrode 270. The etch stop layer 307 including the insulating material such as SiNx or SiOx may use oxygen ($O_2$) as an ashing gas.

In FIG. 21, the manufacturing method thereof is simply illustrated, methods of forming the pixel electrode 192 and the common electrode 270 together may be various, and only the upper portion of the sacrificial layer 300 is described.

First, the non-photosensitive resin is laminated on the entire surface of the liquid crystal panel to form the sacrificial layer 300, and thereafter, an insulating material 307 such as for example SiNx or SiOx is stacked on the entire surface.

Next, the photoresist PR is laminated and then exposed and developed to form a photoresist pattern 306.

Next, the etch stop layer 307 including the insulating material 307 is completed by using the photoresist pattern 306 as a mask.

As described above, the photoresist pattern 306 may be a positive or negative photoresist.

Next, the etch stop layer 307 is etched to remove the exposed sacrificial layer 300 and the photoresist pattern 306 by ashing. Oxygen ($O_2$) may be used as the ashing gas. The etch stop layer 307 including the insulating material is not etched by the ashing gas, and only the sacrificial layer 300 including the non-photosensitive resin and the photoresist pattern 306 are removed. As a result, the structure of the sacrificial layer 300 and the etch stop layer 307 is completed. Even in the present modification, when the non-photosensitive resin is removed by ashing, since anisotropic etching is performed with dry etching equipment, the side wall of the sacrificial layer 300 may be substantially vertically formed. As a result, the side wall of the sacrificial layer 300 does not largely occupy the horizontal area.

According to an embodiment of the manufacturing method, since the sacrificial layer 300 is etched at the upper portion to have a sharp side wall, the microcavity 305 has a sharp side wall. The liquid crystal layer 3 injected into the microcavity 305 does not have a sufficient cell gap at the side wall and thus light leakage phenomenon occurs. In embodiments as those described herein, since the side wall is sharp, the horizontal area is narrow and thus a wide opening area may be ensured.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a liquid crystal display, the method comprising:
    forming a sacrificial layer by stacking a non-photosensitive resin;
    initiating formation of an etch stop layer on the sacrificial layer;
    forming a photoresist pattern;
    completing the etch stop layer using the photoresist pattern;
    ashing the photoresist pattern and the sacrificial layer by using the completed etch stop layer as a mask;
    forming a microcavity by removing the sacrificial layer; and
    forming a liquid crystal layer in the microcavity.

2. The method of manufacturing of claim 1, wherein the photoresist is a negative photoresist.

3. The method of manufacturing of claim 1, wherein the photoresist is a positive resist, and wherein the method further comprises performing hard bake on the photoresist pattern.

4. The method of manufacturing of claim 1, wherein the non-photosensitive resin includes 2-methoxy-1-methylethyl acetate and a novolak resin derivative.

5. The method of manufacturing of claim 4, further comprising
    performing a heat treatment on the sacrificial layer.

6. The method of manufacturing of claim 5, wherein the etch stop layer includes a transparent conductive material.

7. The method of manufacturing of claim 6, wherein the transparent conductive material includes at least one of ITO or IZO.

8. The method of manufacturing of claim 7, wherein at least one of oxygen, or oxygen and $SF_6$, is used as an ashing gas in the ashing.

9. The method of manufacturing of claim 8, wherein the etch stop layer serves as a common electrode receiving a common voltage.

10. The method of manufacturing of claim 9, further comprising
    forming an insulating layer on the completed etch stop layer.

11. The method of manufacturing of claim 8, further comprising
    removing the etch stop layer, and
    forming at least one of a common electrode, a lower insulating layer, or a loop layer.

12. The method of manufacturing of claim 6, wherein the etch stop layer includes an insulating material.

13. The method of manufacturing of claim 12, wherein the insulating material includes at least one of $SiN_x$ or $SiO_x$.

14. The method of manufacturing of claim 13, wherein oxygen is used as an ashing gas in the ashing.

15. The method of manufacturing of claim 1, further comprising:
    forming a plurality of gate lines and a plurality of data lines on an insulation substrate;
    forming a plurality of thin film transistors connected to the gate lines and the data lines; and
    forming a plurality of color filters on the thin film transistors.

16. The method of manufacturing of claim 15, further comprising
    forming light blocking members disposed between two adjacent color filters and corresponding to the data lines and the gate lines.

17. The method of manufacturing of claim 10, further comprising
    forming a loop layer on the insulating layer; and
    etching the loop layer formed on an open region of a liquid crystal hole.

18. The method of manufacturing of claim 17, wherein the liquid crystal layer is formed by injecting a liquid crystal with a capillary force.

19. The method of manufacturing of claim 14, wherein a horizontal width of a sidewall of the sacrificial layer is between about 1 to about 2 μm in the ashing of the sacrificial layer.

20. The method of manufacturing of claim 14, further comprising
    forming a common electrode and a pixel electrode.

* * * * *